US006882207B2

(12) United States Patent
Fujiyama et al.

(10) Patent No.: US 6,882,207 B2
(45) Date of Patent: Apr. 19, 2005

(54) OFFSET CONTROL CIRCUIT

(75) Inventors: Hirokuni Fujiyama, Osaka (JP); Takashi Morie, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/602,740

(22) Filed: Jun. 25, 2003

(65) Prior Publication Data
US 2004/0004507 A1 Jan. 8, 2004

(30) Foreign Application Priority Data

Jun. 25, 2002 (JP) ........................................ 2002-185363

(51) Int. Cl.[7] .............................................. H03L 5/00
(52) U.S. Cl. ......................................... 327/307; 330/9
(58) Field of Search .............................. 327/307; 330/9

(56) References Cited

U.S. PATENT DOCUMENTS 5,365,191 A * 11/1994 Hayashi ....................... 330/252
5,736,885 A * 4/1998 Wietecha et al. ........... 327/307

FOREIGN PATENT DOCUMENTS

JP            7-38345 A        2/1995

* cited by examiner

Primary Examiner—Quan Tra
(74) Attorney, Agent, or Firm—McDermott Will & Emery LLP

(57) ABSTRACT

In an offset control circuit, a voltage/current converting portion generates differential current (I+ and I−) that are proportional to a potential difference between differential input voltage signals (VIN+ and VIN−), and an offset adjusting current-generating portion generates offset adjusting currents (Iofs+ and Iofs−). In a current/voltage converting portion, a current (Ir) that is proportional to a potential difference between differential terminals flows through. Differential current output terminals, offset adjusting current-output terminals and the differential terminals are connected. The offset components contained in the differential input voltage signals (VIN+ and VIN−) are adjusted with the offset adjusting currents (Iofs+ and Iofs−), and differential output voltage signals (VO+ and VO−) in which the offset components are added to the differential input voltage signals (VIN+ and VIN−) are generated.

11 Claims, 13 Drawing Sheets

OFFSET CONTROL CIRCUIT

BACKGROUND OF THE INVENTION

The present invention relates to offset control circuits for adjusting an output voltage so as to correspond to an input voltage.

Conventionally, an offset control circuit as shown in FIG. 16 is used for adjusting the amount of offset contained in the input and output of an operational amplifier, for example.

In FIG. 16, an offset control circuit 200 is configured by connecting the output terminal of an operational amplifier 201 (op-amp) in series with resistors R1 and R2, as well as a variable voltage generating source 202, and connecting the point where the resistors R1 and R2 are connected to the negative input terminal of the operational amplifier 201. An input voltage VIN+ is input to the positive input terminal of the operational amplifier 201, and an output voltage VO is output from the output terminal of the operational amplifier 201.

Here, in order to apply an offset voltage to the input voltage VIN of the operational amplifier 201 and generate the output voltage VO, an output voltage V2 from the variable voltage generating source 202 is freely changeable. Due to the characteristics of the operational amplifier 201, an input voltage V1 (VIN−) applied to the negative input terminal of this operational amplifier 201 is the same as the input voltage VIN+ to the positive input terminal. The output voltage signal VO from the operational amplifier 201 is determined by the resistors R1 and R2, the input voltage VIN+ and the output voltage V2. For this reason, the output voltage VO can be output from the operational amplifier 201 while adjusting its offset with respect to the input voltage VIN by adjusting the output voltage V2 with the variable voltage generating source 202.

The above-described conventional offset control circuit 200, however, is not suited to high-speed operations, because it uses the operational amplifier 201, which operates at low speed. Moreover, the operational amplifier 201 in general cannot operate normally without having a band that is 10 to 100 times the signal band used, so that it is necessary to use powerful transistors, and it is necessary to use even more powerful transistors, in order to configure the operational amplifier 201 so as to be capable of operating at high speeds. This results in the problem of significantly increased power consumption and an increased scale of the circuit.

Further, the above-described conventional offset control circuit 200 is configured such that a single input voltage VIN+ is input to the operational amplifier 201. Therefore, if the input voltage signal VIN+ contains any undesirable components such as noise components, the distortion characteristics of the signal voltage deteriorate, reducing the quality of the output voltage VO.

In order to prevent such deterioration of the distortion characteristics, it is conceivable to input a pair of differential input voltages to the offset control circuit to generate a differential output voltage proportional to the voltage difference between the two input voltages, and use this for the offset adjustment. When a highly accurate analog signal processing is actually performed, it is necessary to carry out the offset adjustment with the differential output voltage in order to prevent the deterioration of the distortion characteristics of the signal voltage.

However, in order to carry out the offset adjustment with the differential output voltage by using the above-described conventional offset control circuit 200, it is necessary to use two offset control circuits 200, resulting in the problem of an increased scale of the circuit.

SUMMARY OF THE INVENTION

Therefore, with the foregoing in mind, it is an object of the present invention to provide an offset control circuit that can be reduced in size without increasing the scale of the circuit, operate at high speeds and prevent the deterioration of the distortion characteristics of signals.

In order to achieve the above-described object, according to the present invention, a differential input voltage is converted into a current, followed by adding an offset adjusting current to this differential current, and the differential current to which this offset adjusting current has been added is converted to a voltage, thereby providing an offset control circuit that can operate at high speeds and can reduce the distortion characteristics of signals without using any operational amplifier.

More specifically, the present invention provides an offset control circuit for adjusting offset voltages contained in differential voltages that are input from a pair of differential voltage input terminals and outputting the adjusted differential voltages from a pair of differential voltage output terminals, the offset control circuit comprising: a voltage/current converting portion that includes the pair of differential voltage input terminals and a pair of differential current output terminals, that generates a pair of differential output currents corresponding to a potential difference between a pair of differential input voltages input from the pair of differential voltage input terminals, and that outputs the pair of differential output currents from the pair of differential current output terminals; an offset adjusting current-generating portion that includes a pair of offset adjusting current-output terminals connected to the pair of differential current output terminals of the voltage/current converting portion, and at least two offset adjusting current-control terminals, that generates a pair of offset adjusting currents by being controlled by offset adjusting current control signals input from the offset adjusting current-control terminals, and that outputs the pair of offset adjusting currents from the pair of offset adjusting current-output terminals; and a current/voltage converting portion that includes a pair of differential terminals connected to the pair of differential current output terminals of the voltage/current converting portion, the pair of offset adjusting current-output terminals of the offset adjusting current-generating portion and the pair of differential voltage output terminals, that feeds a current flowing between the two differential terminals constituting the pair of differential terminals, that converts the current into a corresponding voltage, and that generates the converted voltage at the pair of differential voltage output terminals.

Preferably, in the above-described offset control circuit of the present invention, the voltage/current converting portion includes: a pair of bias current sources connected to the pair of differential current output terminals; a pair of first transistors whose first driving terminals are connected to the pair of differential current output terminals, respectively, and whose gates are both connected to a control terminal; and a pair of second transistors whose first driving terminals are connected to second driving terminals of the pair of first transistors, respectively, whose gates are connected to the pair of differential voltage input terminals, respectively, and whose second driving terminals are connected to a reference potential supplying point.

In accordance with another aspect, the present invention also provides an offset control circuit for adjusting offset voltages contained in differential voltages that are input from a pair of differential voltage input terminals and outputting the adjusted differential voltages from a pair of differential voltage output terminals, the offset control circuit comprising: a voltage/current converting portion that includes the pair of differential voltage input terminals, a pair of differential current output terminals connected to the pair of differential voltage output terminals, a pair of bias current sources to which the pair of differential current output terminals are connected, a pair of first transistors whose first driving terminals are connected to the pair of differential current output terminals and whose gates are connected to a pair of control terminals and a pair of second transistors whose first driving terminals are connected to second driving terminals of the pair of first transistors, whose gates are connected to the pair of differential voltage input terminals, respectively, and whose second driving terminals are connected to a reference potential supplying point, that generates a pair of differential output currents corresponding to a potential difference between a pair of differential input voltages input from the pair of differential voltage input terminals, and that outputs the differential output currents from the pair of differential current output terminals; an offset adjusting current-generating portion that includes a pair of offset adjusting current-output terminals connected to the first driving terminals of the pair of second transistors of the voltage/current converting portion, and at least two offset adjusting current-control terminals, that generates a pair of offset adjusting currents by being controlled by offset adjusting current-control signals input from the offset adjusting current-control terminals, and that outputs the pair of offset adjusting currents from the pair of offset adjusting current-output terminals; and a current/voltage converting portion that includes a pair of differential terminals connected to the pair of differential current output terminals of the voltage/current converting portion, that feeds a current flowing between the two differential terminals constituting the pair of differential terminals, that converts the current into a corresponding voltage, and that generates the converted voltage at the pair of differential voltage output terminals.

Preferably, in the above-described offset control circuit, the voltage/current converting portion includes: a pair of bias current sources to which the pair of differential current output terminals are connected, respectively; a pair of second transistors whose first driving terminals are connected to the pair of differential current output terminals, respectively, and whose gates are connected to the pair of differential voltage input terminals, respectively; a pair of first transistors whose first driving terminals are connected to second driving terminals of the pair of second transistors, respectively, whose gates are both connected to a control terminal and whose second driving terminals are connected to a reference potential supplying point; and resistor means having a predetermined resistance and being connected between the second driving terminals of the pair of second transistors.

Preferably, in the above-described offset control circuit, the voltage/current converting portion includes: a pair of bias current sources to which the pair of differential current output terminals are connected, respectively; and a pair of transistors whose first driving terminals are connected to the pair of differential current output terminals, respectively, whose gates are connected to the pair of differential voltage input terminals, respectively, and whose second driving terminals are connected to a reference potential supplying point.

Preferably, in the above-described offset control circuit, the current/voltage converting portion is resistor means having a predetermined resistance and being connected between the pair of differential terminals.

Preferably, in the above-described offset control circuit, the current/voltage converting portion includes: a pair of third transistors whose first driving terminals are connected to the pair of differential terminals, respectively, and whose gates are both connected to an input/output current control terminal; and a pair of fourth transistors whose first driving terminals are connected to second driving terminals of the pair of third transistors, respectively, whose gates are connected to the pair of differential terminals, respectively, and whose second driving terminals are connected to a reference potential supplying point.

Preferably, in the above-described offset control circuit, the current/voltage converting portion is a fifth transistor that is connected between the pair of differential terminals and whose gate is connected to an input/output current control terminal.

Preferably, in the above-described offset control circuit, the offset adjusting current-generating portion includes: a current source; and a pair of sixth transistors whose second driving terminals are connected to the current source, whose gates are connected to two of the offset adjusting current-control terminals, respectively, and whose first driving terminals are connected to the pair of offset adjusting current-output terminals, respectively.

Preferably, in the above-described offset control circuit, the offset adjusting current-generating portion includes n (n is a natural number) sub-offset adjusting current-generating portions; wherein the sub-offset adjusting current-generating portions each include an offset adjusting current-control terminal to which a one-bit signal out of an n-bit register signal is input such that the one-bit signals do not overlap with each other; a current source; and a pair of seventh transistors whose second driving terminals are connected to the current source, one of whose gates is connected to the offset adjusting current-control terminal, the other of whose gates is connected to the offset adjusting current-control terminal via an inverter and whose first driving terminals are connected to the pair of offset adjusting current-output terminals, respectively; and wherein a pair of sub-offset adjusting currents generated in each of the sub-offset adjusting current-generating portions are supplied to the pair of offset adjusting current-output terminals, respectively.

The present invention also provides a signal processing device comprising: the above-described offset control circuit; and a processing circuit that performs predetermined processing for a differential output voltage whose offset voltage has been adjusted with the offset control circuit; wherein the offset control circuit and the processing circuit are formed on a single chip.

Preferably, in the above-described signal processing device, the signal processing device is a part of a DVD reproduction device; wherein the offset control circuit adjusts an offset voltage contained in a signal read out from a DVD and outputs the adjusted signal as a differential output voltage; and wherein the processing circuit includes: a front-end having a filter that performs a filtering process on the differential output voltage whose offset voltage has been adjusted with the offset control circuit; and a back-end that converts an output signal from the front-end into an image signal and an audio signal.

As described above, the present invention has the following functions.

According to the present invention, the differential current output terminals of the voltage/current converting portion from which differential output currents (I+ and I−) that are proportional to the potential difference between the differential input voltage signals (VIN+ and VIN−) are output, the offset adjusting current-output terminals of the offset adjusting current-generating portion from which the offset adjusting currents (Iofs+ and Iofs−) are output, and the differential terminals of the current/voltage converting portion to/from which a differential input/output current (Ir) that is proportional to the potential difference between the differential terminals is input/output are connected. Accordingly, the differential output voltages (VO+ and VO−) that are proportional to the total current of the differential output currents and the offset adjusting currents are output from the differential voltage output terminals connected to the differential terminals. Therefore, when the differential input voltages (VIN+ and VIN−) contain the offset voltages (Voff+ and Voff−), it is possible to adjust these offset voltages with the offset adjusting currents (Iofs+ and Iofs−) and add the offset adjusting signals corresponding to the offset voltages to the differential input voltages (VIN+ and VIN−), thereby generating the differential output voltages (VO+ and VO−).

Accordingly, the addition of the offset adjusting voltages to the differential input voltages is performed by a current addition after converting these voltages into the differential output currents (I+ and I−) and the offset adjusting currents (Iofs+ and Iofs−), so that it is possible to perform the offset voltage adjustment at high speeds.

Moreover, the offset control circuit according to the present invention can reduce the scale of the circuit since it does not require any operational amplifier (op-amp) unlike the conventional offset control circuit. It also has a strong noise resistance and hardly causes signal distortion, because it performs the processing of differential signals.

DETAILED DESCRIPTION OF THE INVENTION

Hereinbelow, preferred embodiments of the present invention are described with reference to the appended drawings.

First Embodiment

Figure 1:
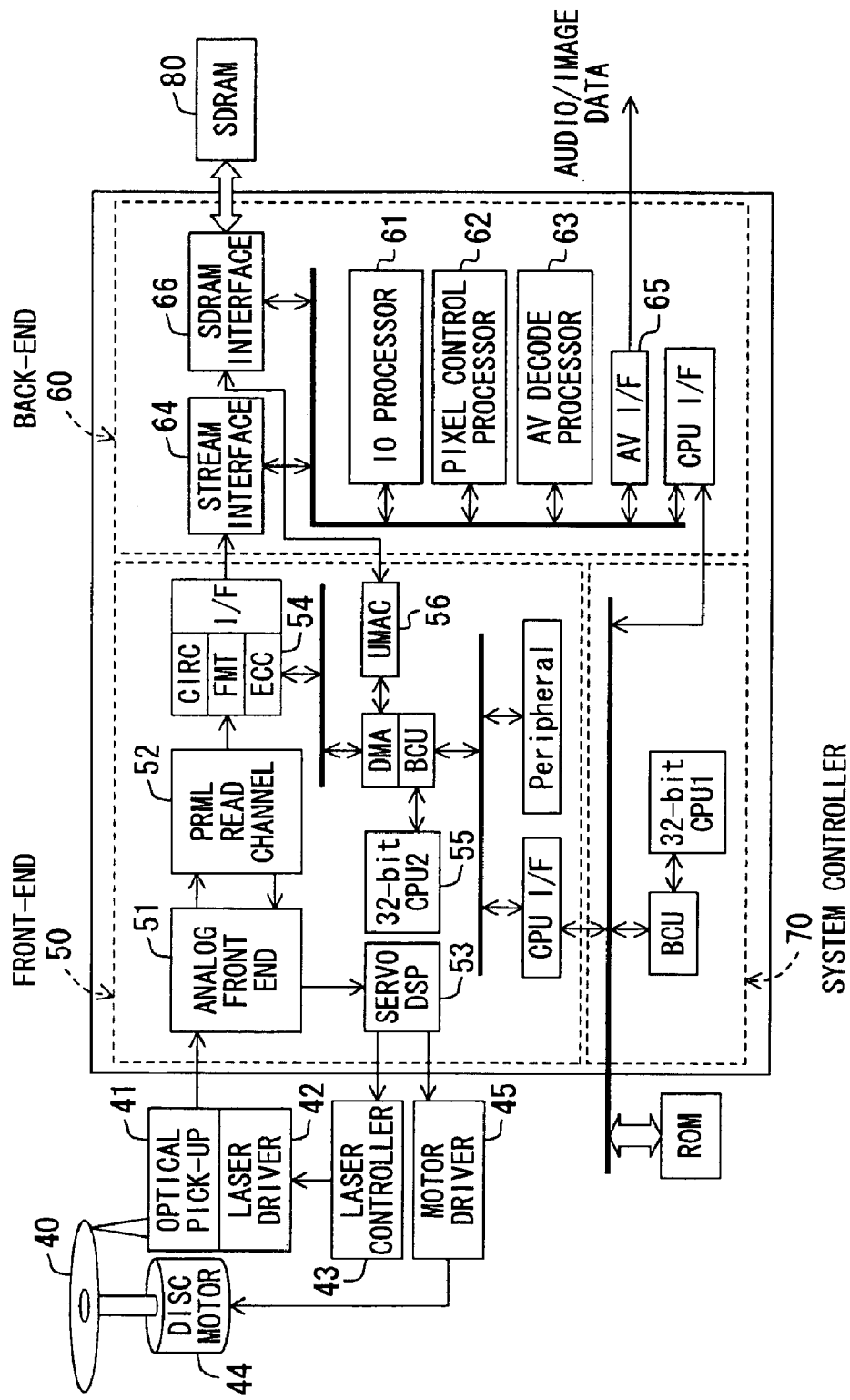
FIG. 1 is a diagram showing the entire configuration of a DVD signal reproduction processing system.

FIG. 1 shows the entire configuration of a DVD signal reproduction processing system including the offset control circuit of the present invention.

In the DVD signal reproduction processing system (signal processing device) shown in the figure, numeral 40 denotes a DVD or CD (hereinafter, collectively called DVD), 41 denotes an optical pick-up for retrieving signals from the DVD, which is driven by a laser driver 42. This laser driver 42 is controlled by a laser controller 43. Numeral 44 denotes a disc motor for rotatively driving the DVD 40, which is driven by a motor driver 45.

Further, numeral 50 denotes a front-end, 60 denotes a back-end and 70 denotes a system controller, which are mounted on the same chip and integrated into one chip. Briefly, the front-end 50 performs data extraction processing including the readout, demodulation and error correction of data from the DVD 40, while performing a servo control and a laser control by outputting control signals to the laser controller 43 and the motor driver 45. On the other hand, the back-end 60 converts the reproduction signals of the DVD 40 that are sent from the front-end 50 into image signals and audio signals. Further, the system controller 70 coordinates a series of the processings performed by the front-end 50 and those performed by the back-end 60.

The front-end 50 includes, as its main portions, an analog front end 51 for performing such processing as the noise removal of the signals read out from the DVD 40 by the optical pick-up 41, and a digital PRML read channel 52. As described below, the analog front end 51 includes an offset control circuit 51c (see FIG. 2) of the present invention. This analog front end 51 calculates a servo focus error signal and a tracking error signal, and outputs these signals to a servo DSP 53. This servo DSP 53 controls the motor driver 45 such that the optical pick-up 41 accurately traces the recording data on the DVD 40, and controls the laser controller 43 so as to perform a laser power control.

The PRML read channel 52 performs, in cooperation with the analog front end 51, a PR (Partial Response) processing of reproducing the original waveform by utilizing the property of the reproduction signals of being subjected to intersymbol interferences, and reads out the data with the highest probability from the reproduction signals based on the characteristics of the recording signals of the DVD 40. The data extracted from the PRML read channel 52 is output to a formatter FMT. An ECC 54 performs Reed-Solomon error correction (error-correcting code) of the above-described extracted data. The data for which the modulation and the error correction have been completed is output to the back-end 60, via an AUDIO/VISUAL interface I/F. The above-described processes are controlled by a 32-bit CPU 55.

On the other hand, the back-end 60 includes an IO processor 61, a pixel control processor 62 and an AV decode processor 63. AUDIO/VISUAL data input from the front-end 50 via a stream interface 64 is subjected to a stream analysis with the IO processor 61, pixel processing with the pixel control processor 62 and decode processing with the AV decode processor 63, and is then output as audio/video data, via an AV interface 65.

In FIG. 1, an SDRAM 80 is provided outside the chip, and is shared by the front-end 50 and the back-end 60. Access to the SDRAM 80 is coordinated by an SDRAM interface 66 included in the back-end 60. When the front-end 50 accesses the SDRAM 80, it accesses the SDRAM interface 66, via a UMAC 56 included in the front-end 50.

Figure 2:
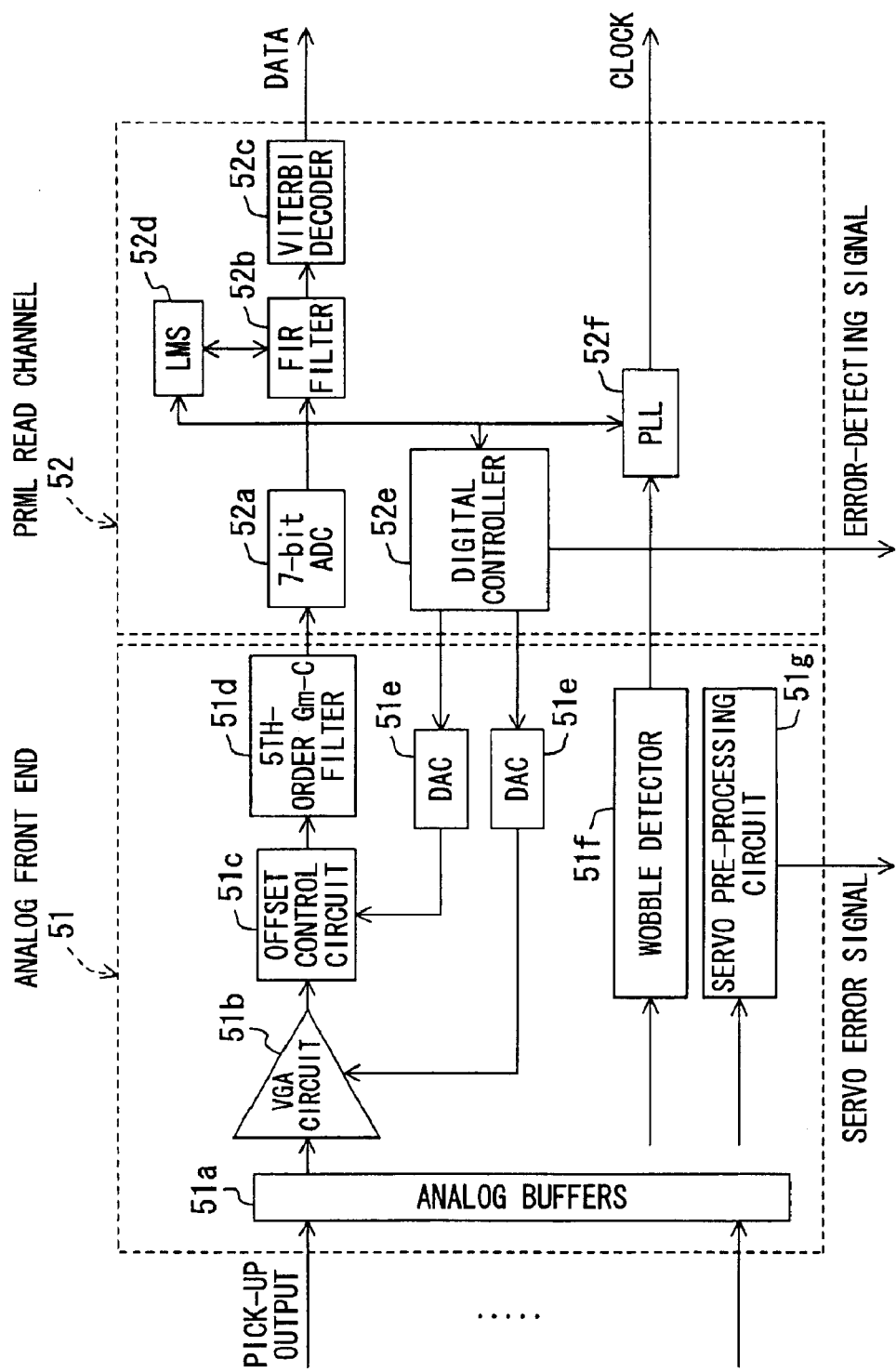
FIG. 2 is a diagram showing the internal configurations of an analog front end and a PRML read channel, each provided with the same DVD signal reproduction processing system.

FIG. 2 shows the internal configurations of the analog front end 51 and the PRML read channel 52.

In the figure, the analog front end 51 includes analog buffers 51a, a VGA circuit 51b, the offset control circuit 51c of the present invention, a 5th-order Gm-C filter 51d, two DACs (Digital Analog Converters) 51e, a wobble detector 51f and a servo pre-processing circuit 51g. On the other hand, the PRML read channel 52 includes a 7-bit ADC (Analog Digital Converters) 52a, a 7-tap FIR (adaptive equalization) filter 52b, a Viterbi decoder 52c, an LMS 52d, a digital controller 52e and a PLL 52f. The above-described PR processing is performed with the 5th-order Gm-C filter 51d of the analog front end 51 and the FIR filter 52b of the PRML read channel 52. The PRML read channel 52 demodulates the data quantized with the ADC 52a to detect peaks and bottoms, and performs the amplitude control of the RF signals and the offset control in the offset control circuit 51c based on the results of the modulation. This offset control is performed through an 8-bit digital control.

Next, the offset control circuit 51c provided in the analog front end 51 is specifically described.

Figure 3:
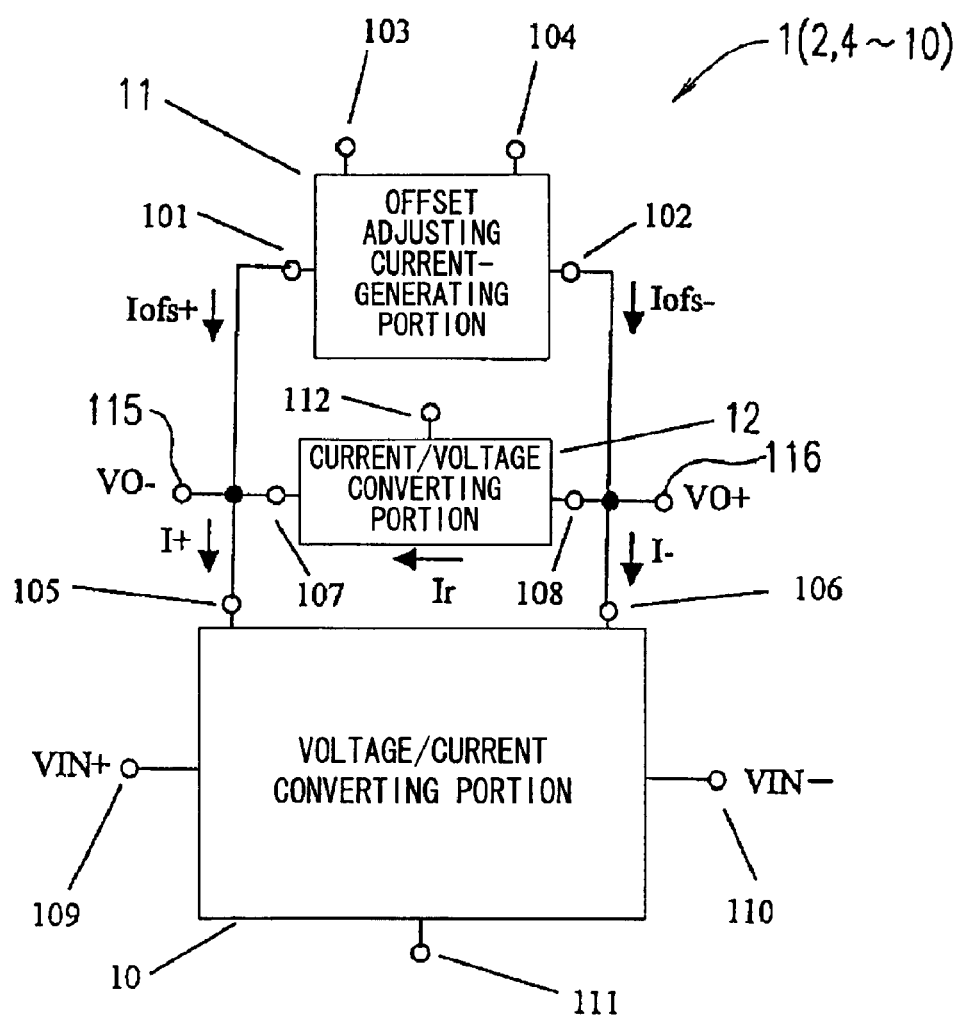
FIG. 3 is a block diagram showing an example of the configuration of the offset control circuit according to a first embodiment of the present invention.

FIG. 3 is a block diagram showing an example of the configuration of the offset control circuit according to the first embodiment of the present invention.

In FIG. 3, an offset control circuit 1 includes a voltage/current converting circuit 10, an offset adjusting current-generating circuit 11 connected to the two output terminals of the voltage/current converting circuit 10, and a current/voltage converting circuit 12 connected to the two output terminals of the voltage/current converting circuit 10.

The voltage/current converting circuit 10 includes a pair of differential voltage input terminals 109 and 110, a control terminal 111 and a pair of differential current output terminals 105 and 106. Differential input voltages VIN+ and VIN− are input to the pair of differential voltage input terminals 109 and 110, respectively, and controlled by the control signal input to the control terminal 111, and differential output currents I+ and I− are generated that are proportional to the differential input voltages VIN+ and VIN−, respectively. The generated differential output currents I+ and I− are output from the pair of differential current output terminals 105 and 106, respectively.

When the conversion coefficient of this voltage/current converting circuit 10 is Gm, the following relational expressions hold between the differential input voltages VIN+ and VIN, and the differential output currents I+ and I−:

$$I+ = Gm \times VIN+ \quad \text{(Equation 1)}$$

$$I- = Gm \times VIN- \quad \text{(Equation 2)}$$

The offset adjusting current-generating circuit 11 includes a pair of offset adjusting current-output terminals 101 and 102, and a pair of offset adjusting current-control terminals 103 and 104, is controlled by the control signal input to the offset adjusting current-control terminals 103 and 104, and generates offset adjusting currents Iofs+ and Iofs−. The generated offset adjusting currents Iofs+ and Iofs− are output from the pair of offset adjusting current-output terminals 101 and 102, respectively.

The current/voltage converting circuit 12 includes a pair of differential terminals 107 and 108, and an input/output current control terminal 112, and is configured such that a current (differential input/output current) Ir that is proportional to the potential difference between the pair of differential terminals 107 and 108 flows through it. The differential terminal 107 of the current/voltage converting circuit 12 is connected to the differential current output terminal 105 of the voltage/current converting circuit 10 and the offset adjusting current-output terminal 101 of the offset adjusting current-generating circuit 11. Similarly, the differential terminal 108 of the current/voltage converting circuit 12 is connected to the differential current output terminal 106 of the voltage/current converting circuit 10 and the offset adjusting current-output terminal 102 of the offset adjusting current-generating circuit 11. The pair of differential terminals 107 and 108 are connected to a pair of differential voltage output terminals 115 and 116, respectively, from which differential output voltage signals VO− and VO+ are output, respectively.

When the differential input/output current flowing through the current/voltage converting circuit 12 is Ir and the direction of the current flowing from the differential terminal 108 towards the differential terminal 107 is positive in the offset control circuit 1 of this embodiment having the above-described configuration, the following expression holds for the differential terminal 107:

$$I+ = Ir + Iofs+ \quad \text{(Equation 3)}$$

and the following expression holds for the differential terminal 108:

$$I- = -Ir + Iofs- \quad \text{(Equation 4)}$$

From the above Equations 3 and 4, the differential input/output current Ir flowing between the differential terminals 107 and 108 of the current/voltage converting circuit 12 is given as:

$$Ir = (1/2) \times \{(I+ - I-) + (Iofs+ - Iofs-)\} \quad \text{(Equation 5)}$$

$$= (1/2) \times \{(I+ + Iofs+) - (I- + Iofs-)\} \quad \text{(Equation 6)}$$

From the above Equations 1, 2 and 5, the differential input/output current Ir is given as:

$$Ir = (1/2) \times Gm(VIN+ - VIN-) + \quad \text{(Equation 7)}$$

$$(1/2) \times (Iofs+ - Iofs-)$$

Accordingly, when the conversion efficient of the current/voltage converting circuit 12 is R, the differential output voltage (VO+−VO−) output from the differential voltage output terminals 116 and 115 is given as:

$$VO+ - VO- = Ir \times R \quad \text{(Equation 8)}$$

$$= \{(1/2) \times Gm(VIN+ - VIN-) + \quad \text{(Equation 9)}$$
$$(1/2) \times (Iofs+ - Iofs-)\} \times R$$

Next, let us consider a case where the differential input voltage signals VIN+ and VIN− that are input from the differential voltage input terminals 109 and 110, respectively, contain an offset voltage. When the offset voltage of each of the differential input voltage VIN+ and VIN− is Voff, the differential output currents I+ and I− output from the voltage/current converting circuit 10 are given as:

$$I+ = Gm \times (VIN+ + Voff) \quad \text{(Equation 10)}$$

$$I- = Gm \times (VIN- - Voff) \quad \text{(Equation 11)}$$

Accordingly, from the above Equations (6), (10) and (11), the differential input/output current Ir flowing through the current/voltage converting circuit 12 in the offset control circuit 1 is given as:

$$Ir = (1/2) \times \{(Gm \times (VIN+ + Voff) + Iofs+) - \quad \text{(Equation 12)}$$
$$Gm \times (VIN- - Voff) + Iofs-)\}$$

From this, the differential output voltage (VO+−VO−) is given as:

$$VO+ - VO- = (1/2) \times R \times Gm \times (VIN+ - VIN-) + \quad \text{(Equation 13)}$$
$$(1/2) \times R \times \{(Gm \times Voff + Iofs+) - $$
$$(-Gm \times Voff + Iofs-)\}$$

From the above Equation 13, it can be seen that in the differential output voltages VO+ and VO− of the offset control circuit 1, the offset current (Gm×Voff) of the differential input voltages VIN+ and VIN− is adjusted with the offset adjusting currents Iofs+ and Iofs−.

As described above, this embodiment is based on the processing of differential signals, so that it does not require the operational amplifier 201 for the addition of the input voltage and the offset voltage, unlike the conventional example. Moreover, since the addition of the offset voltage to the input voltage is achieved by a simple current addition based on Kirchhoffs law after converting the input voltage and the offset voltage into currents, it is possible to adjust the offset voltage at very high speed.

Additionally, in a conventional offset addition method using the operational amplifier 201, it is necessary to set the band of the operational amplifier 201 to about one or two orders higher than the band of the input signals, causing problems such as the increase of the circuit scale and power consumption, and the decrease of the processing speed limit. However, according to the first embodiment, it is possible to reduce the circuit scale and to perform the offset addition processing at higher speed, by a simple current addition based on Kirchhoffs law.

Furthermore, the offset control circuit 1 according to this embodiment is based on the processing of differential signals, so that it has a strong noise resistance and signal distortion hardly occurs. Although it is also possible to perform the processing of differential signals with the conventional offset control circuit 200 by providing two offset control circuits 200, this requires twice the circuit scale and power consumption. In contrast to this, it is possible to perform an offset adjusting process using differential signals with the offset control circuit 1 according to this embodiment, by using a reduced circuit scale.

Although the front-end 50 including the offset control circuit 1, the back-end 60 and the system controller 70 are integrated into a single chip in this embodiment, it is of course also possible to integrate only the front-end 50 including the offset control circuit 1 into a single chip.

In addition, although the offset control circuit 1 provided in a DVD signal reproduction processing system is described in this embodiment, the present invention is not limited thereto and can be similarly used as the offset control circuits provided in systems other than DVD signal reproduction processing systems. In that case, the offset control circuit and a processing circuit for performing the predetermined processing for the differential output voltages in which the offset voltage is adjusted with the offset control circuit may be integrated into a single chip.

Second Embodiment

The second embodiment describes a case where an offset control circuit 2 is realized by using a voltage/current converting circuit 10A as one specific example of the voltage/current converting circuit 10.

Figure 4:
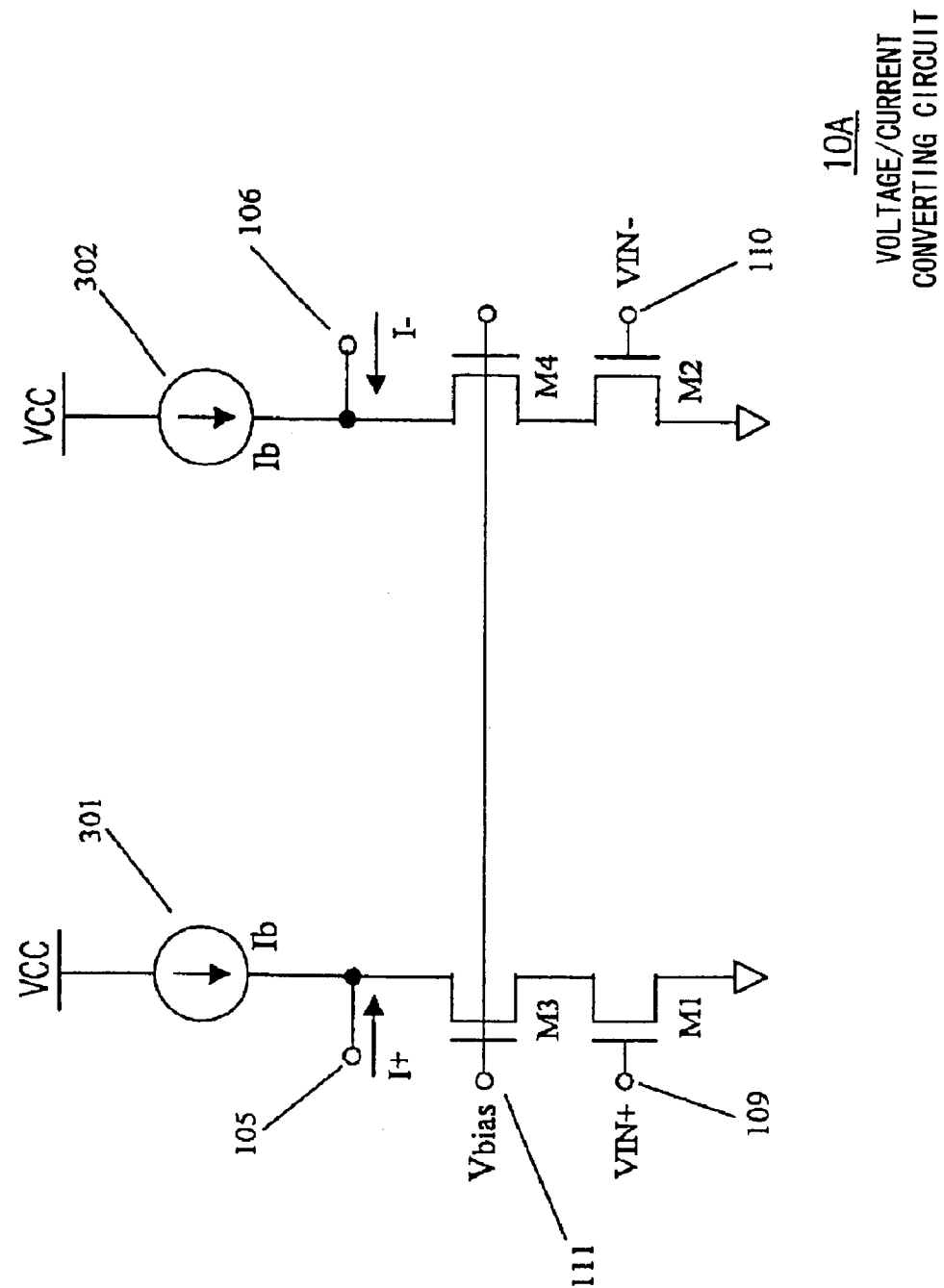
FIG. 4 is a circuit diagram showing one specific example of the voltage/current converting circuit shown in FIG. 3.

FIG. 4 is a circuit diagram showing one specific example of the voltage/current converting circuit 10 shown in FIG. 3.

In FIG. 4, the voltage/current converting circuit 10A includes a pair of bias current sources 301 and 302, a pair of first N-type transistors M3 and M4 that are connected to the bias current sources 301 and 302, respectively, and a pair of second N-type transistors M1 and M2 that are connected to the first N-type transistors M3 and M4, respectively.

The bias current sources 301 and 302 are connected to the differential current output terminals 105 and 106, respectively, so that a bias current Ib flows through the differential current output terminals 105 and 106.

The gates of the first transistors M3 and M4 are both connected to the control terminal 111, and a control voltage Vbias is input to these gates. The drains of the first transistors M3 and M4 are connected to the differential current output terminals 105 and 106, respectively, and the differential currents I+ and I− are output from the differential current output terminals 105 and 106, respectively.

The gates of the second N-type transistors M1 and M2 are connected to the differential voltage input terminals 109 and 110, respectively, and the differential input voltage signals VIN+ and VIN− are input to the gates of the differential voltage input terminals 109 and 110, respectively. The drains of the second N-type transistors M1 and M2 are connected to the sources of the first transistors M3 and M4, respectively, and their sources are grounded.

With the above-described configuration, the first N-type transistors M3 and M4 each operate as a source follower circuit in the voltage/current converting circuit 10A, and the control voltage Vbias is input to the gates of the first transistors M3 and M4, and a voltage that has been decreased by about the threshold voltage Vth is output from the sources of the first N-type transistors M3 and M4. Consequently, the drain voltages of the second N-type transistors M1 and M2 are maintained constant, and the drain-source voltages Vds of the second N-type transistors M1 and M2 are maintained substantially constant.

The second N-type transistors M1 and M2 are each biased so as to operate in their unsaturated region. The drain currents IDS1 and IDS2 flowing through the second N-type transistors M1 and M2 at this time are given as:

$$IDS1 = \beta \times (VIN+ - Vth - Vds/2) \times Vds \quad \text{(Equation 14)}$$

$$IDS2 = \beta \times (VIN- - Vth - Vds/2) \times Vds \quad \text{(Equation 15)}$$

where β is the transconductance of the second transistors M1 and M2, Vds is the drain-source voltage of the second N-type transistors M1 and M2).

Here, in the voltage/current converting circuit 10A of the second embodiment, the differential output current (I+−I−) is equal to IDS1−IDS2, and this differential output current flows into the current/voltage converting circuit 12.

This results in the following equation:

$$I+ - I- = IDS1 - IDS2 \quad \text{(Equation 16)}$$
$$= \beta \times (VIN+ - VIN-) \times Vds$$

From the above Equation 16, it can be seen that the differential-output current I+−I− is proportional to the differential input voltage VIN+−VIN−, and the proportional coefficient (conversion efficient) Gm is β×Vds.

As described above, the voltage/current converting circuit 10A of the second embodiment operates as a differential voltage/current converting circuit. Therefore, by using this as the voltage/current converting circuit 10 shown in FIG. 3, it is possible to realize the offset control circuit 2 of the second embodiment. This voltage/current converting circuit 10A can reduce the distortion of signals by biasing the second N-type transistors M1 and M2 such that they operate in the unsaturated region. Using this voltage/current converting circuit 10A to configure the offset control circuit 2 can prevent the deterioration of the distortion characteristics. It should be noted that when the voltage/current converting circuit 10 is configured as in FIG. 4, the effect of achieving high-speed operation and size reduction in the offset control circuit 1 described in the above first embodiment will not be lost in any way.

In addition, with the voltage/current converting circuit 10A of the second embodiment, it is possible to adjust the conversion coefficient Gm in the above Equation 13 by adjusting the control voltage Vbias. This means that it is possible to control the input/output voltage ratio, i.e., (1/2)×R×Gm, which is the coefficient of the differential input voltages VIN+ and VIN−, in the above Equation 13. Accordingly, the offset control circuit 2 of the second embodiment not only has the offset adjusting function, but also can serve as a variable amplifier for changing the amplification factor of signals.

Furthermore, with the voltage/current converting circuit 10A of the second embodiment, it is possible to fix the drain voltages of the second N-type transistors M1 and M2 more accurately. For example, by using an op-amp (operational amplifier), it is possible to control the gate voltages of the first N-type transistors M3 and M4 such that the drain voltages of the second N-type transistors M1 and M2 are constant. Since the op-amp used in this case does not necessarily have to be highly accurate, it is sufficient that the band of the op-amp is about ten times the signal band. When the op-amp for controlling the gate voltages of the first N-type transistors M3 and M4 is provided in this manner, the effect of achieving high-speed operation and size reduction in the offset control circuit 1 described in the above first embodiment will not be lost in any way.

Third Embodiment

The third embodiment describes a case where signal distortion is further reduced in the offset control circuit 2 of the second embodiment.

Figure 5:
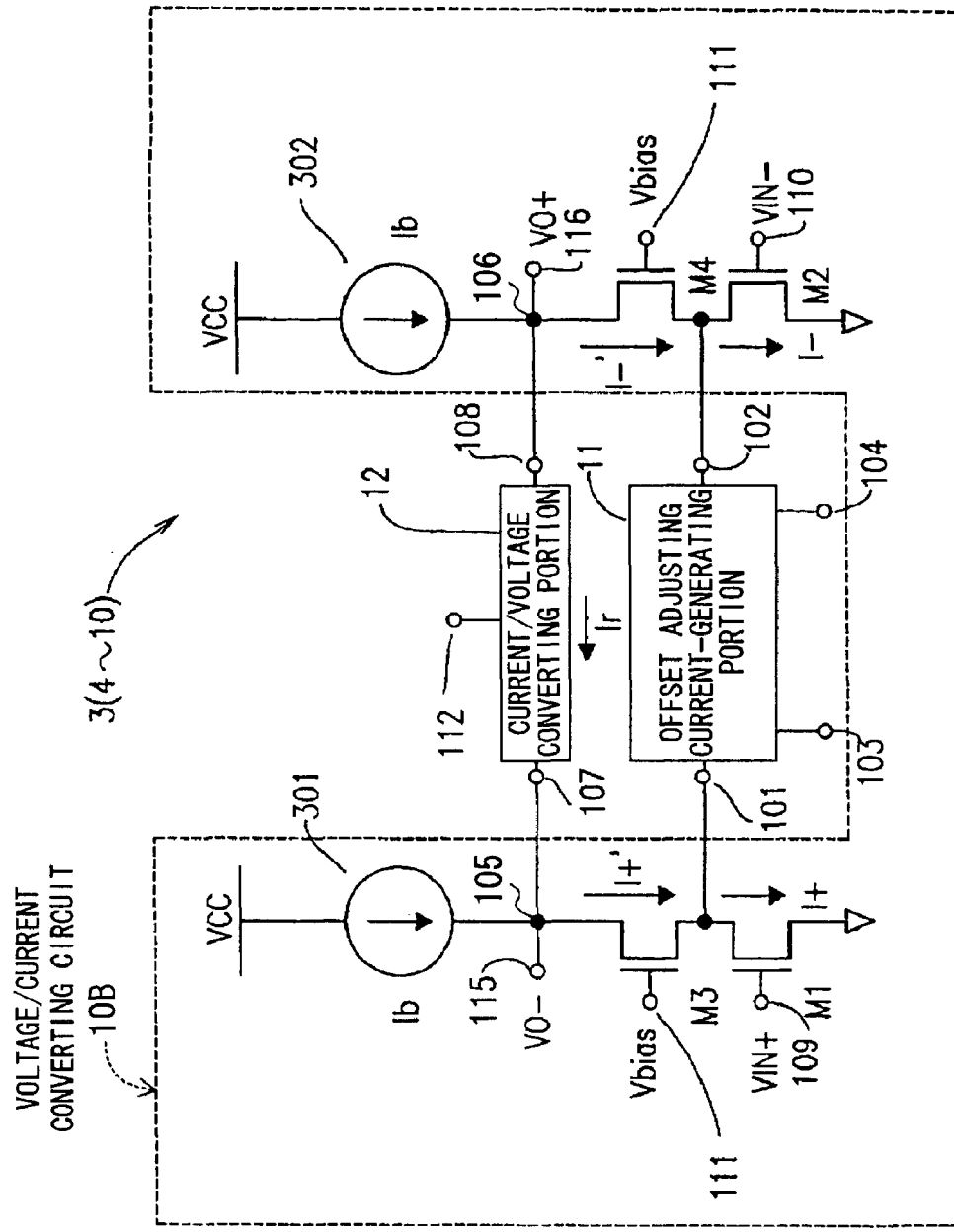
FIG. 5 is a circuit diagram showing an example of the configuration of the offset control circuit according to a third embodiment of the present invention.

FIG. 5 is a circuit diagram showing an example of the configuration of the offset control circuit according to the third embodiment of the present invention.

In FIG. 5, an offset control circuit 3 is realized by connecting the offset adjusting current-output terminals 101 and 102 of the offset adjusting current-generating circuit 11 to the drains of the second N-type transistors M1 and M2, respectively, instead of the drains of the first N-type transistors M3 and M4, of the voltage/current converting circuit 10A in the offset control circuit 2 of the second embodiment. Consequently, the signal distortion in the offset control circuit 2 of the second embodiment is further reduced.

The operation of the offset control circuit 3 according to the third embodiment is described in comparison with those of the offset control circuits 1 and 2 of the above-described first and second embodiments, for a case where the differential input voltage signals VIN+ and VIN− contain an offset voltage and the offset control circuit is operated so as to eliminate the offset voltage using the above-described configuration.

In the offset control circuits 1 and 2 of the first and second embodiments, although the second N-type transistors M1 and M2 and the first N-type transistors M3 and M4 are symmetrical circuits, an offset voltage is superimposed between the differential input voltage signals VIN+ and VIN−. Accordingly, different bias currents flow through these circuits. Such a current asymmetry is cancelled by adding the offset adjusting currents Iofs+ and Iofs− that cancel the offset voltage (offset components) from the offset adjusting current-generating circuit 11 at the drains of the first N-type transistors M3 and M4. However, signal distortion is likely to occur, because the second N-type transistors M1 and M2 and the first N-type transistors M3 and M4 operate in an asymmetric state.

On the other hand, in the offset control circuit 3 of the third embodiment, the offset adjusting currents Iofs+ and Iofs− from the offset adjusting current-generating circuit 11 are added to the differential output currents I+ and I− at the drains of the second N-type transistors M1 and M2, so that the current asymmetry is eliminated at this instant and the first N-type transistors M3 and M4 operate as symmetrical differential circuits also for bias currents I+' and I−'. Consequently, the offset control circuit 3 of the third embodiment can reduce signal distortion occurring in the first N-type transistors M3 and M4 to a lower level than the offset control circuits 1 and 2 of the first and second embodiments.

Furthermore, although the second N-type transistors M1 and M2 operate in an asymmetric state in the offset control circuit 3 of the third embodiment, they operate in the unsaturated region, so that even when their bias currents are different, the voltage/current characteristics are substantially the same as long as the source-drain voltages Vds are the same. Accordingly, signal distortion occurring in the offset control circuit 3 as a whole can be reduced even further than in the first and second embodiments.

It should be noted that when the offset control circuit 3 is configured as in FIG. 5, the effect of achieving high-speed operation and size reduction in the offset control circuit 1 described in the above first embodiment will not be lost in any way.

Fourth Embodiment

The fourth embodiment describes a case where an offset control circuit 4 that controls input/output gains through a resistance ratio by using a voltage/current converting circuit 10C as another specific example of the voltage/current converting circuit 10.

Figure 6:
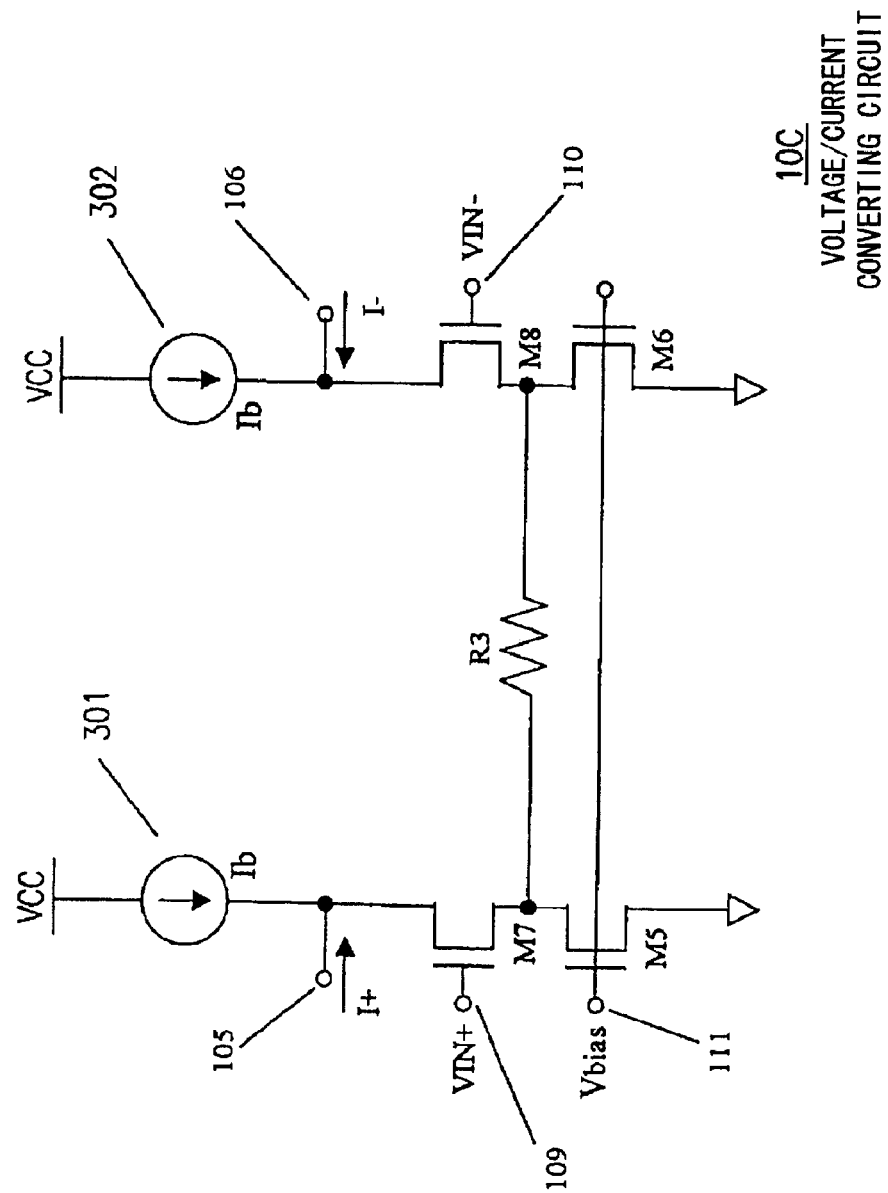
FIG. 6 is a circuit diagram showing another specific example of the voltage/current converting circuit shown in FIG. 3.

FIG. 6 is a circuit diagram showing another specific example of the voltage/current converting circuit 10 shown in FIG. 3.

In FIG. 6, the voltage/current converting circuit 10C includes a pair of bias current sources 301 and 302, a pair of first N-type transistors M7 and M8 and a pair of second N-type transistors M5 and M6. Two series circuits, one made up of the bias current source 301, the first N-type transistor M7 and the second N-type transistor M5, the other made up of the bias current source 302, the first N-type transistor M8 and the second N-type transistor M6, are provided in the voltage/current converting circuit 10C. Further, a resistor R3 is disposed between the point where the first N-type transistor M7 and the second N-type transistor M5 are connected and the point where the first N-type transistor M8 and the second N-type transistor M6 are connected.

The bias current sources 301 and 302 are connected to the differential current output terminals 105 and 106, respectively, so that a bias current Ib flows through the differential current output terminals 105 and 106.

The gates of the first N-type transistors M7 and M8 are connected to the differential voltage input terminals 109 and 110, respectively, and the differential input voltages VIN+ and VIN− are input to the differential voltage input terminals 109 and 110, respectively. Further, the drains of the first N-type transistors M7 and M8 are connected to the differential current output terminals 105 and 106, respectively, and the resistor R3 is connected between the sources of the first N-type transistors M7 and M8.

The gates of the second N-type transistors M5 and M6 are both connected to the control terminal 111, and a control voltage Vbias is input to that control terminal 111. Further, the drains of the second N-type transistors M5 and M6 are connected to the sources of the first N-type transistors M7 and M8, respectively, and their sources are grounded.

In the voltage/current converting circuit 10C of the fourth embodiment having the above-described configuration, the first N-type transistors M7 and M8 each operate as a source follower circuit. Based on the differential input voltage signal VIN+ and VIN− respectively input to the gates of the first N-type transistors M7 and M8, a voltage that has been decreased by about the threshold voltage Vth is output from the sources and applied across the resistor R3. Consequently, a potential difference (VIN+−VIN−) is generated in the resistor R3, and a current (VIN+−VIN−)/R3 is generated according to Ohm's law.

Therefore, the current conversion efficient Gm in the voltage/current converting circuit 10C of the fourth embodiment is approximately 1/R3, and the differential output current (VIN+−VIN−)/R3 is output from the differential current output terminals 105 and 106, via the first N-type transistors M7 and M8. The second N-type transistors M5 and M6 each operate as a circuit for applying a bias current to the first N-type transistors M7 and M8.

As described above, the voltage/current converting circuit 10C of the fourth embodiment operates as a differential voltage/current converting circuit. By using this as the voltage/current converting circuit 10 shown in FIG. 3, it is possible to realize the offset control circuit 4. Since the current/voltage coefficient Gm of this voltage/current converting circuit 10 is approximately 1/R3, the input/output voltage ratio in the case of operating this the voltage/current converting circuit 10 as the offset control circuit 4, i.e., $(1/2) \times Gm \times R$, which is the conversion efficient of the differential input voltage signals VIN+ and VIN−, in the above Equation 13 is $(1/2) \times (R/R3)$ and it can be seen that it depends on the ratio of the resistor R (conversion efficient) of the current/voltage converting circuit 12 to the resistor R3 of the voltage/current converting circuit 10. Therefore, the input/output gains of the offset control circuit 4 of the fourth embodiment can be controlled through a resistance ratio.

It should be noted that when the voltage/current converting circuit 10 is configured as in FIG. 6, the effect of achieving high-speed operation and size reduction in the offset control circuit 1 described in the above first embodiment will not be lost in any way.

Additionally, in the voltage/current converting circuit 10C of the fourth embodiment, it is possible to apply feedback by using an op-amp in such a manner that the source potentials of the first N-type transistors M7 and M8 are equal to the gate potentials of the first N-type transistors M7 and M8. This makes it possible to further reduce signal distortion and increase the accuracy of the setting of input/output gains with a resistance value. When the voltage/current converting circuit 10 is provided with an op-amp for controlling the gate potentials and the source potentials of the first N-type transistors M7 and M8 in this manner, the effect of achieving high-speed operation and size reduction in the offset control circuit 1 described in the above first embodiment will not be lost in any way.

Fifth Embodiment

The fifth embodiment describes a case where an offset control circuit 5 that can operate at very high speed is realized by using a voltage/current converting circuit 10D as yet another specific example of the voltage/current converting circuit 10.

Figure 7:
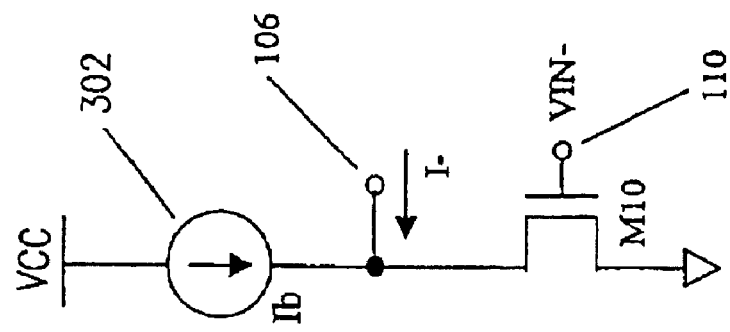
FIG. 7 is a circuit diagram showing yet another specific example of the voltage/current converting circuit shown in FIG. 3.
Figure 7:
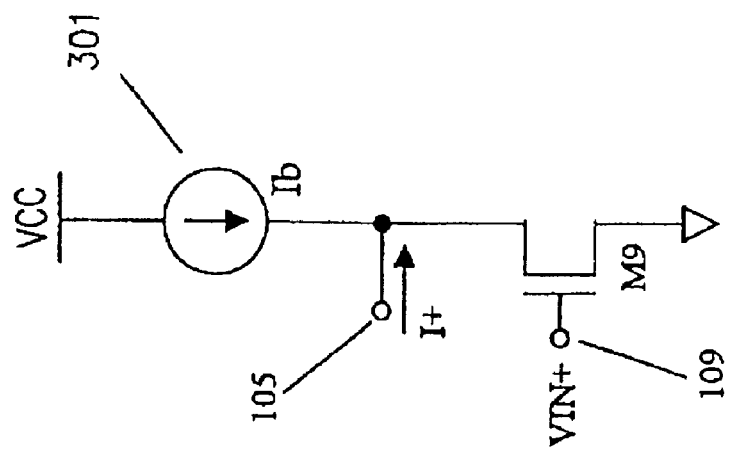

FIG. 7 is a circuit diagram showing yet another specific example of the voltage/current converting circuit 10 shown in FIG. 3.

In FIG. 7, the voltage/current converting circuit 10D includes a pair of bias current sources 301 and 302, a pair of N-type transistors M9 and M10. Two series circuits, one made up of the bias current source 301 and the N-type transistor M9, the other made up of the bias current source 302 and the N-type transistor M10, are provided in the voltage/current converting circuit 10D.

The bias current sources 301 and 302 are connected to the differential current output terminals 105 and 106, respectively, so that a bias current Ib flows through the differential current output terminals 105 and 106.

The gates of the N-type transistors M9 and M10 are connected to the differential voltage input terminals 109 and 110, respectively, and the differential input voltages VIN+ and VIN− are input to the differential voltage input terminals 109 and 110, respectively. Further, the drains of the N-type transistors M9 and M10 are connected to the differential current output terminals 105 and 106, respectively, and the sources of the N-type transistors M9 and M10 are grounded.

In the voltage/current converting circuit 10D of the fifth embodiment having the above-described configuration, the differential input voltage (VTN+−VTN−) input to the gates of the N-type transistors M9 and M10 is converted to a current in accordance with the voltage/current conversion characteristics of the N-type transistors M9 and M10, and then output as the differential current (I+−I−) from the differential current output terminals 105 and 106.

As described above, the voltage/current converting circuit 10D of the fifth embodiment operates as a differential voltage/current converting circuit. Accordingly, by using this as the voltage/current converting circuit 10 shown in FIG. 3, it is possible to realize the offset control circuit 5 of the fifth embodiment. This voltage/current converting circuit 10D can operate at very high speed, since only the N-type transistors M9 and M10 are present between the differential voltage input terminals 109 and 110 and the differential current output terminals 105 and 106. Therefore, the offset control circuit 5 of the fifth embodiment can operate at very high speed. It should be noted that when the voltage/current converting circuit 10 shown in FIG. 3 is configured as in FIG. 7, the effect of achieving high-speed operation and size reduction in the offset control circuit 1 described in the above first embodiment will not be lost in any way.

Sixth Embodiment

The sixth embodiment describes a case where an offset control circuit 6 is realized by using a current/voltage converting circuit 12A as one specific example of the current/voltage converting circuit 12.

Figure 8:
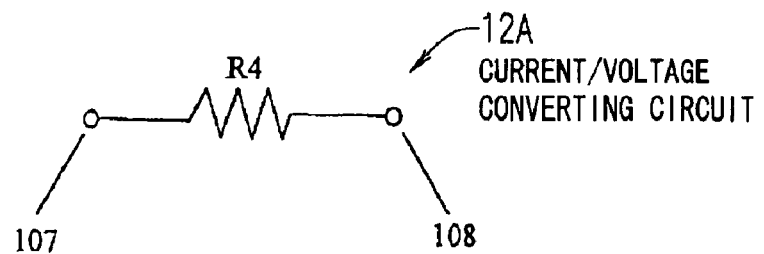
FIG. 8 is a circuit diagram showing one specific example of the current/voltage converting circuit shown in FIG. 3.

FIG. 8 is a circuit diagram showing one specific example of the current/voltage converting circuit 12 shown in FIG. 3.

In FIG. 8, a resistor R4 is disposed between differential terminals 107 and 108 in the current/voltage converting circuit 12A.

In the current/voltage converting circuit 12A of the sixth embodiment having the above-described configuration, the resistor R4 can generate a voltage across the two terminals (differential terminals) 107 and 108 that is proportional to a current (differential input/output current Ir) flowing through the resistor R4. Therefore, by using this as the current/voltage converting circuit 12 shown in FIG. 3, it is possible to realize the offset control circuit 6 of the sixth embodiment.

It should be noted that when the current/voltage converting circuit 12 shown in FIG. 3 (or FIG. 5) is configured as in FIG. 8, the effect of achieving high-speed operation and size reduction in the offset control circuits 1 and 3 described in the above first embodiment (or the above third embodiment) will not be lost in any way.

Seventh Embodiment

The seventh embodiment describes a case where an offset control circuit 7 is realized by using a current/voltage converting circuit 12B as another specific example of the current/voltage converting circuit 12.

Figure 9:
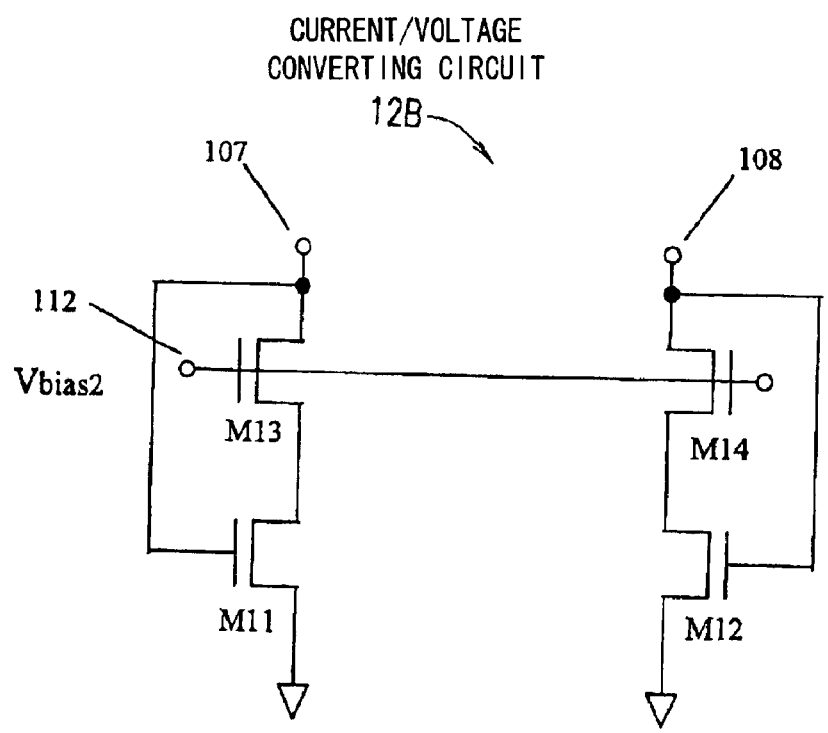
FIG. 9 is a circuit diagram showing another specific example of the current/voltage converting circuit shown in FIG. 3.

FIG. 9 is a circuit diagram showing another specific example of the current/voltage converting circuit 12 shown in FIG. 3.

In FIG. 9, the current/voltage converting circuit 12B includes a pair of differential terminals 107 and 108, a pair of first N-type transistors M13 and M14 and a pair of second N-type transistors M11 and M12.

The differential terminal 107, the first N-type transistor M13 and the second N-type transistor M11 are connected in series, and also the differential terminal 108, the first N-type transistor M14 and the second N-type transistor M12 are connected in series. The gates of the first N-type transistors M13 and M14 are both connected to an input/output current control terminal 112, and a control voltage Vbias2 is input to the input/output current control terminal 112. The gates of the second N-type transistors M11 and M12 are connected to the differential terminals 107 and 108, respectively, and a voltage proportional to a differential input/output current Ir is applied to the differential terminals 107 and 108.

In the current/voltage converting circuit 12B of the seventh embodiment having the above-described configuration, the first N-type transistors M13 and M14 and the second N-type transistors M11 and M12 operate in the same manner as the first transistors M3 and M4 and the second transistors M1 and M2 of the voltage/current converting circuit 10B shown in FIG. 5, respectively. More specifically, the first N-type transistors M13 and M14 each operate as a source follower circuit, and, based on the control voltage Vbias2 input to the gates of the first N-type transistors M13 and M14, a voltage that has been decreased by about the threshold voltage Vth is output from the sources. Consequently, the drain voltages of the second N-type transistors M11 and M12 are maintained constant, and the drain-source voltages Vds of the second N-type transistors M11 and M12 are maintained substantially constant.

The second N-type transistors M11 and M12 are each biased so as to operate in the unsaturated region, and a current proportional to the voltages applied to the gates of the second N-type transistors M11 and M12 is input/output from the differential terminals 107 and 108.

Therefore, the current/voltage converting circuit 12 of the seventh embodiment operates in such a manner that the differential input/output current Ir proportional to the voltage applied across the differential terminals 107 and 108 is input/output from the differential terminals 107 and 108. In other words, it operates in such a manner that a voltage is generated across the differential terminals 107 and 108 that is proportional to the differential input/output current that is input/output to the differential terminals 107 and 108.

As described above, the current/voltage converting circuit 12B of the seventh embodiment operates as a differential current/voltage converting circuit. Therefore, by using this as the current/voltage converting circuit 12 shown in FIG. 3 (or FIG. 5), it is possible to realize the offset control circuit 7. In the current/voltage converting circuit 12B of the seventh embodiment, it is possible to adjust the current/voltage conversion coefficient R in the above Equation 13 by adjusting the control voltage Vbias2. Accordingly, the offset control circuit 7 of the seventh embodiment not only has the offset adjustment function, but also can serve as a variable amplifier capable of changing the amplification factor of signals. It should be noted that when the current/voltage converting circuit 12 shown in FIG. 3 (or FIG. 5) is configured as in FIG. 9, the effect of achieving high-speed operation and size reduction in the offset control circuits 1 and 3 described in the above first embodiment (or the above third embodiment) will not be lost in any way.

Eighth Embodiment

The eighth embodiment describes a case where an offset control circuit 8 is realized by using a current/voltage converting circuit 12C as yet another specific example of the current/voltage converting circuit 12.

Figure 10:
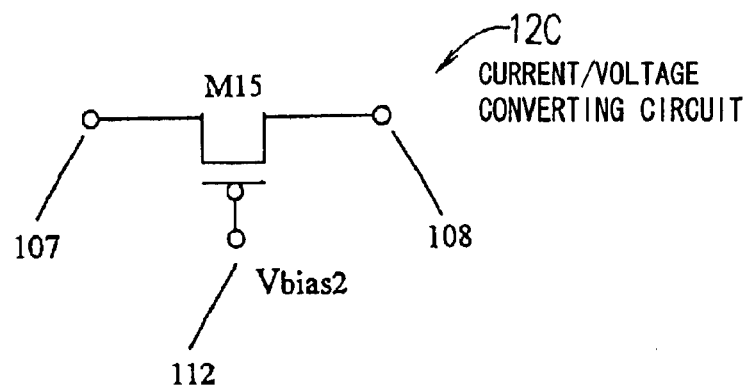
FIG. 10 is a circuit diagram showing yet another specific example of the current/voltage converting circuit shown in FIG. 3.

FIG. 10 is a circuit diagram showing yet another specific example of the current/voltage converting circuit 12 shown in FIG. 3.

In FIG. 10, as the current/voltage converting circuit 12C, a P-type transistor M15 is disposed between differential terminals 107 and 108. The gate of this P-type transistor M15 is connected to an input/output current control terminal 112, and a control voltage Vbias2 is input to the input/output current control terminal 112.

In the current/voltage converting circuit 12C of the eighth embodiment having the above-described configuration, the P-type transistor M15 operates as a variable resistor whose resistance can be controlled in accordance with the control voltage Vbias2 applied to the gate of the P-type transistor M15.

As described above, the current/voltage converting circuit 12C of the eighth embodiment operates as a differential current/voltage converting circuit. Therefore, by using this as the current/voltage converting circuit 12 shown in FIG. 3 (or FIG. 5), it is possible to realize the offset control circuit 8 of the eighth embodiment. In the current/voltage converting circuit 12C of the eighth embodiment, it is possible to adjust the current/voltage conversion coefficient R in the above Equation 13 by adjusting the control voltage Vbias2.

Accordingly, the offset control circuit 8 of the eighth embodiment not only has the offset adjustment function, but also can serve as a variable amplifier capable of changing the amplification factor of signals. It should be noted that when the current/voltage converting circuit 12 shown in FIG. 3 (or FIG. 5) is configured as in FIG. 10, the effect of achieving high-speed operation and size reduction in the offset control circuits 1 and 3 described in the above first embodiment (or the above third embodiment) will not be lost in any way.

Ninth Embodiment

The ninth embodiment describes a case where an offset control circuit 9 is realized by using an offset adjusting current-generating circuit 11A as one specific example of the offset adjusting current-generating circuit 11.

Figure 11:
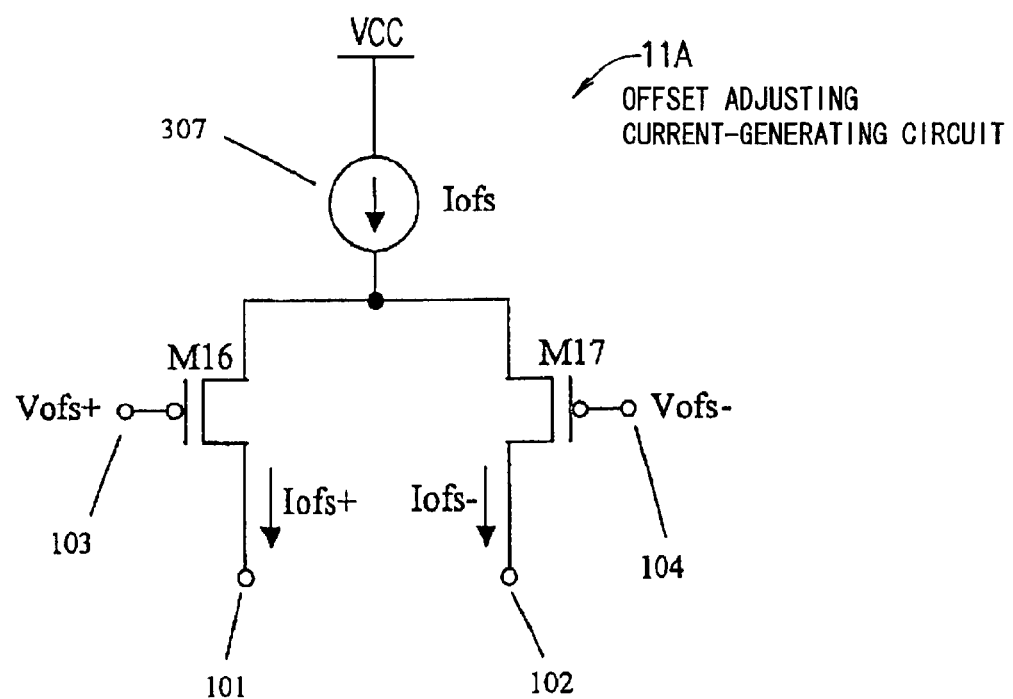
FIG. 11 is a circuit diagram showing one specific example of the offset adjusting current-generating circuit shown in FIG. 3.

FIG. 11 is a circuit diagram showing one specific example of the offset adjusting current generating circuit 11 shown in FIG. 3.

In FIG. 11, the offset adjusting current-generating circuit 11A includes a bias current source 307, a pair of P-type transistors M16 and M17 and a pair of offset adjusting current-output terminals 101 and 102.

The bias current source 307 is connected to the sources of the P-type transistors M16 and M17 in such a manner that a bias current Iofs is divided into two branches so as to flow through the P-type transistors M16 and M17.

The gates of the P-type transistors M16 and M17 are connected to offset adjusting current-control terminals 103 and 104, respectively, and offset adjusting current-control voltages Vofs+ and Vofs– are input to the offset adjusting current-control terminals 103 and 104, respectively. The drains of the P-type transistors M16 and M17 are connected to the offset adjusting current-output terminals 101 and 102, respectively, and offset adjusting currents Iofs+ and Iofs– flow through the offset adjusting current-output terminals 101 and 102.

In the offset adjusting current-generating circuit 11A of the ninth embodiment having the above-described configuration, the amounts of the offset adjusting currents Iofs+ and Iofs– are adjusted with the offset adjusting current-control voltages Vofs+ and Vofs–, respectively.

Thus, by using the offset adjusting current-generating circuit 11A as the offset adjusting current-generating circuit 11 shown in FIG. 3 (or FIG. 5), it is possible to realize the offset control circuit 9 of the ninth embodiment.

It should be noted that when the offset adjusting current-generating circuit 11 shown in FIG. 3 (or FIG. 5) is configured as in FIG. 11, the effect of achieving high-speed operation and size reduction in the offset control circuits 1 and 3 described in the above first embodiment (or the above third embodiment) will not be lost in any way.

Figure 12:
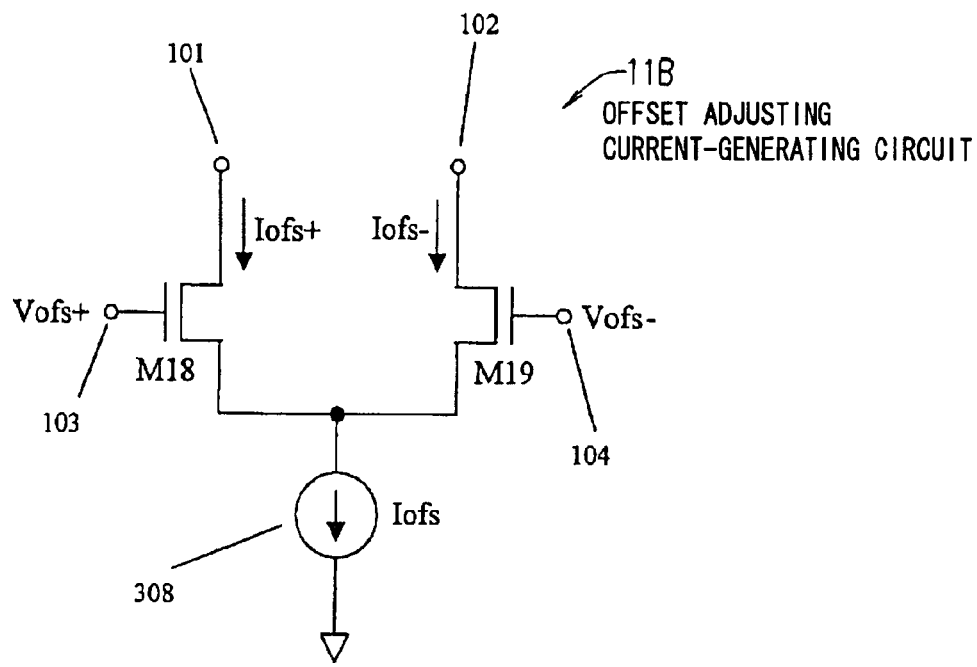
FIG. 12 is a circuit diagram showing another specific example of the offset adjusting current-generating circuit shown in FIG. 3.

Additionally, it is also possible to configure an offset adjusting current-generating circuit 11B as shown in FIG. 12 by using a bias current source 308 and P-type transistors M18 and M19, each having the opposite polarity as that of the bias current source 307 and the P-type transistors M16 and M17 in the offset adjusting current-generating circuit 11A of the ninth embodiment. Also in this case, as described above, when the offset adjusting current-generating circuit 11 shown in FIG. 3 (or FIG. 5) is configured as in FIG. 12, the effect of achieving high-speed operation and size reduction in the offset control circuits 1 and 3 described in the above first embodiment (or the above third embodiment) will not be lost in any way.

Tenth Embodiment

The tenth embodiment describes a case where an offset control circuit 10 is realized by using a digitally controllable offset adjusting current-generating circuit 13 that is different from the offset adjusting current-generating circuit 11.

Figure 13:
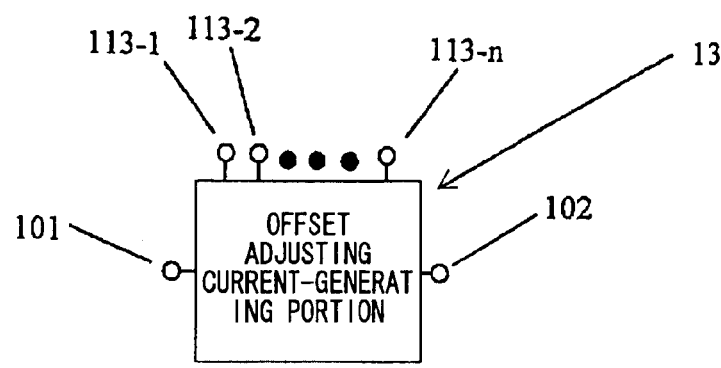
FIG. 13 is a circuit diagram showing an example of the configuration of an offset adjusting current-generating circuit that is different from the offset adjusting current-generating circuit shown in FIG. 3.

FIG. 13 is a circuit diagram showing an example of the configuration of an offset adjusting current-generating circuit that is different from the offset adjusting current-generating circuit 11 shown in FIG. 3.

In FIG. 13, the offset adjusting current-generating circuit 13 includes, in place of the offset adjusting current-control terminals 103 and 104 of the offset adjusting current-generating circuit 11 shown in FIG. 3 (or FIG. 5), input terminals (offset adjusting current-control terminals) 113-1 to 113-n to which one-bit register signals of an n-bit register signal (n is a natural number) are input, respectively. The offset adjusting currents Iofs+ and Iofs– can be controlled with high accuracy, in accordance with the state of the n-bit register signal input from the input terminals 113-1 to 113-n.

Figure 14:
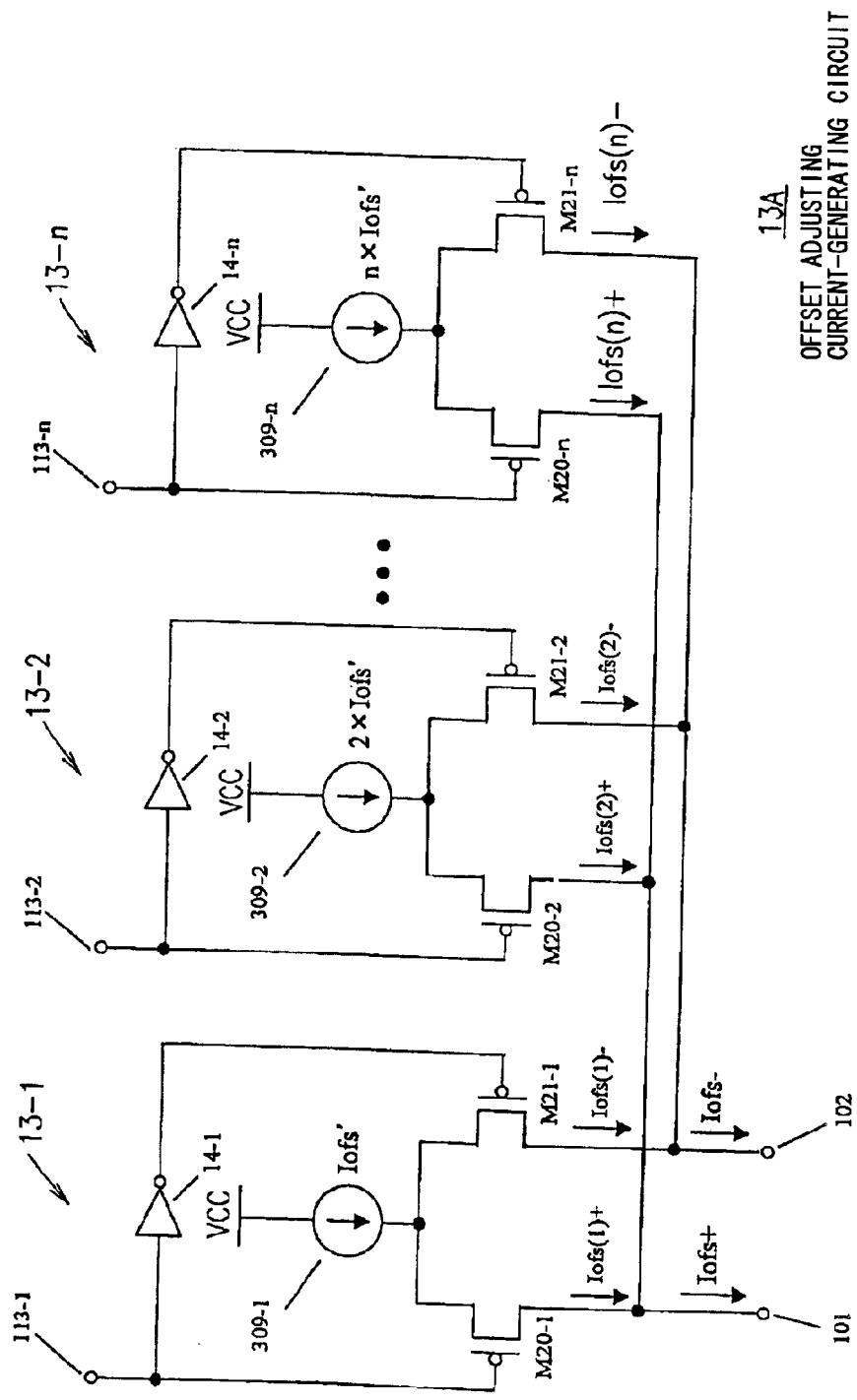
FIG. 14 is a circuit diagram showing one specific example of the offset adjusting current-generating circuit shown in FIG. 13.

FIG. 14 is a circuit diagram showing one specific example of the offset adjusting current-generating circuit 13 shown in FIG. 13.

In FIG. 14, an offset adjusting current-generating circuit 13A includes n sub-offset adjusting current-generating portions 13-1 to 13-n. The sub-offset adjusting current-generating portions 13-1 to 13-n include, respectively, inverters 14-1 to 14-n, bias current sources 309-1 to 309-n and pairs of P-type transistors M20-1 to M20-n and M21-1 to M21-n.

The bias current source 309-1 is connected to the sources of the P-type transistors M20-1 and M21-1, and a bias current is divided into two branches so as to flow through the sources of the P-type transistors M20-1 and M21-1. Similarly, the bias current source 309-n (n is a natural number) is connected to the sources of the P-type transistors M20-n and M21-n, and a bias current is divided into two branches so as to flow through the sources of the P-type transistors M20-n and M21-n. The current values of the bias current sources 309-1 to 309-n are weighted to be Iofs', 2×Iofs', ..., and n×Iofs', respectively.

The gates of the P-type transistors M20-1 to M20-n are connected to the input terminals 113-1 to 113-n, respectively, and a one-bit register signal is input to the input terminals 113-1 to 113-n. Further, the input terminals 113-1 to 113-n are connected to the gates of the P-type transistors M21-1 to M21-n, respectively, via inverters 14-1 to 14-n, respectively, and the inverted signal of the one-bit register signal (offset adjusting current control signal) is input to the gates of the P-type transistors M21-1 to M21-n.

The drains of the P-type transistors M20-1 to M20-n are connected to an offset adjusting current-output terminal 101, and sub-offset adjusting currents Iofs (1)+ to Iofs (n)+ all flow through the offset adjusting current-output terminal 101. The drains of the P-type transistors M21-1 to M21-n are connected to an offset adjusting current-output terminal 102, and the sub-offset adjusting currents Iofs (1)– to Iofs (n)– all flow through the offset adjusting current-output terminal 102. Consequently, the values of the offset adjusting current Iofs+ is the sum of Iofs (1)+, Iofs (2)+, ... Iofs (n)+, and the value of the offset adjusting current Iofs– is the sum of Iofs (1)–, Iofs (2)–, ... Iofs (n)–.

In the offset adjusting current-generating circuit 13A of the tenth embodiment having the above-described configuration, the register signal serving as the control signal for controlling the offset adjusting currents is input from the input terminals 113-1 to 113-n. For example, when the register signal input to the input terminal 113-1 is at level H, a signal at level H is applied to the gate of the P-type transistor M20-1 in the sub-offset adjusting current-generating circuit 13-1. The register signal input to the input terminal 113-1 is inverted by the inverter 14-1 to level L, so that a signal at level L is applied to the gate of the P-type transistor M21-1. Each of the P-type transistors M20-1 and M21-1 is in an ON state when a signal at level L is applied to their gates, so that the P-type transistor M20-1 is in an OFF state and Iofs (1)+ does not flow through it, whereas the P-type transistor M21-1 is in an ON state and Iofs (1)− flows through it.

On the other hand, when the register signal input to the input terminal 113-1 is at level L, a signal at level L is applied to the gate of the P-type transistor M20-1. Further, the register signal input to the input terminal 113-1 is inverted by the inverter 14-1 to level H, so that a signal at level H is applied to the gate of the P-type transistor M21-1. Accordingly, the P-type transistor M20-1 is in an ON state and Iofs (1)+ flows through it, whereas the P-type transistor M21-1 is in an OFF state and Iofs (1)− does not flow through it.

As described above, in accordance with the state of the register signal input to the input terminal 113-1, either Iofs (1)+ or Iofs (1)− flows through the sub-offset adjusting current-generating circuit 13-1. The currents Iofs (1)+ and Iofs (1)− are equal to the bias current Iofs−', when they flow through the sub-offset adjusting current-generating circuit 13-1.

Similarly, in accordance with the state of the register signals input from the input terminals 113-2 to 113-n, the P-type transistors M20-2 to M20-n are turned on and off in order to set Iofs (2)+, . . . Iofs (n)+, and the P-type transistors M21-2 to M21-n are turned on and off in order to set Iofs (2)−, . . . Iofs (n)−.

At this time, when either one of the currents of the sets of currents (Iofs (1)+ and Iofs (1)−), (Iofs (2)+ and Iofs (2)−), . . . and (Iofs (n)+ and Iofs (n)−) flows, the other one does not flow.

Each of the register signal is made up of n bits, and there are n possible register signals for the case where all of the register signals are at level L (LL, . . . L) to the case where all of the register signals are at level H (HH, . . . H).

When all of the register signals are at level L, all of the P-type transistors M20-1 to M20-n are in an ON state, the offset adjusting current Iofs+ flows and the amount of the offset adjusting current Iofs+ is at the maximum. At this time, all of the P-type transistors M21-1 to M21-n are in an OFF state, and the offset adjusting current Iofs− does not flow.

When all of the register signals are at level L, all of the P-type transistors M21-1 to M21-n are in an ON state, the offset adjusting current Iofs− flows and the amount of the offset adjusting current Iofs− is at the maximum. At this time, all of the P-type transistors M20-1 to M20-n are in an OFF state, and the offset adjusting current Iofs+ does not flow.

When not all of the register signals are at level L or level H, a number of P-type transistors M20-1 to M20-n is turned on that is equal to the number of the register signals at level L among the n-bit register signals, and accordingly Iofs (1)+, Iofs (2)+, . . . Iofs (n)+ flows, and the sum of these currents is the offset adjusting current Iofs+. Further, a number of P-type transistors M21-1 to M21-n is turned on that is equal to the number of the register signals at level H among the n-bit register signals, and accordingly Iofs (1)−, Iofs (2)−, . . . Iofs (n)− flows, and the sum of these currents is the offset adjusting current Iofs−.

As described above, the offset adjusting current-generating circuit 13A of the tenth embodiment operates as a DA converter that outputs differential currents, making it possible to adjust the offset adjusting currents Iofs+ and Iofs− with n-bit register signals at an accuracy of Iofs+/n or Iofs−/n. Moreover, according to the tenth embodiment, the offset adjusting current-generating circuit 13 is configured as an n-bit DA converter, so that it is possible to control the amount of offset adjustment with a digital circuit, thereby easily realizing a further variety of offset adjustment.

Further, it is possible to improve the accuracy of the current adjustment by increasing the number n of the register signals in the offset adjusting current-generating circuit 13A shown in FIG. 14. It should be noted that when the offset adjusting current-generating circuit 13 shown in FIG. 13 is configured as in FIG. 14, the effect of achieving high-speed operation and size reduction in the offset control circuits 1 and 3 described in the above first embodiment (or the third embodiment) will not be lost in any way.

Figure 15:
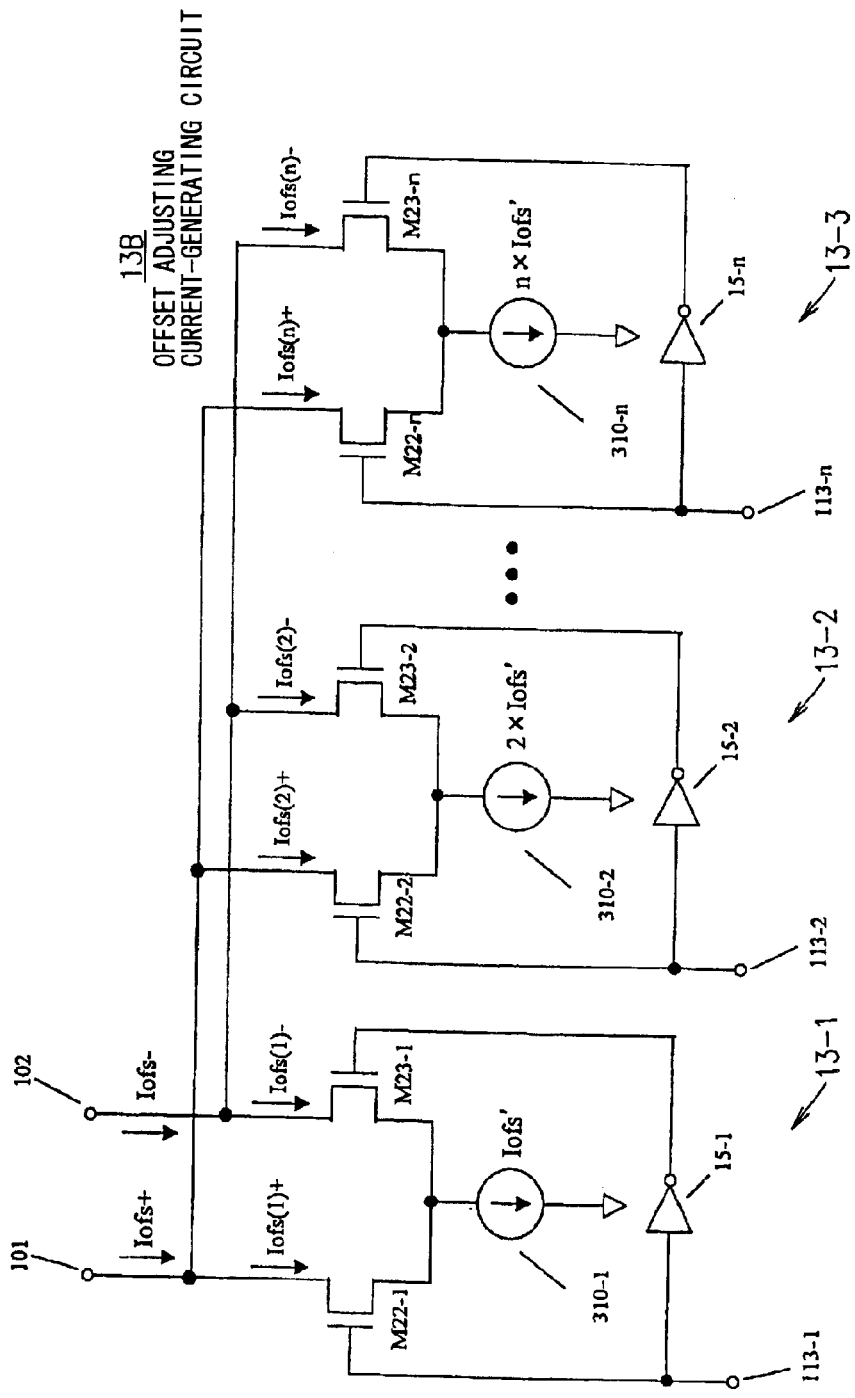
FIG. 15 is a circuit diagram showing another specific example of the offset adjusting current-generating circuit shown in FIG. 13.
Figure 16:
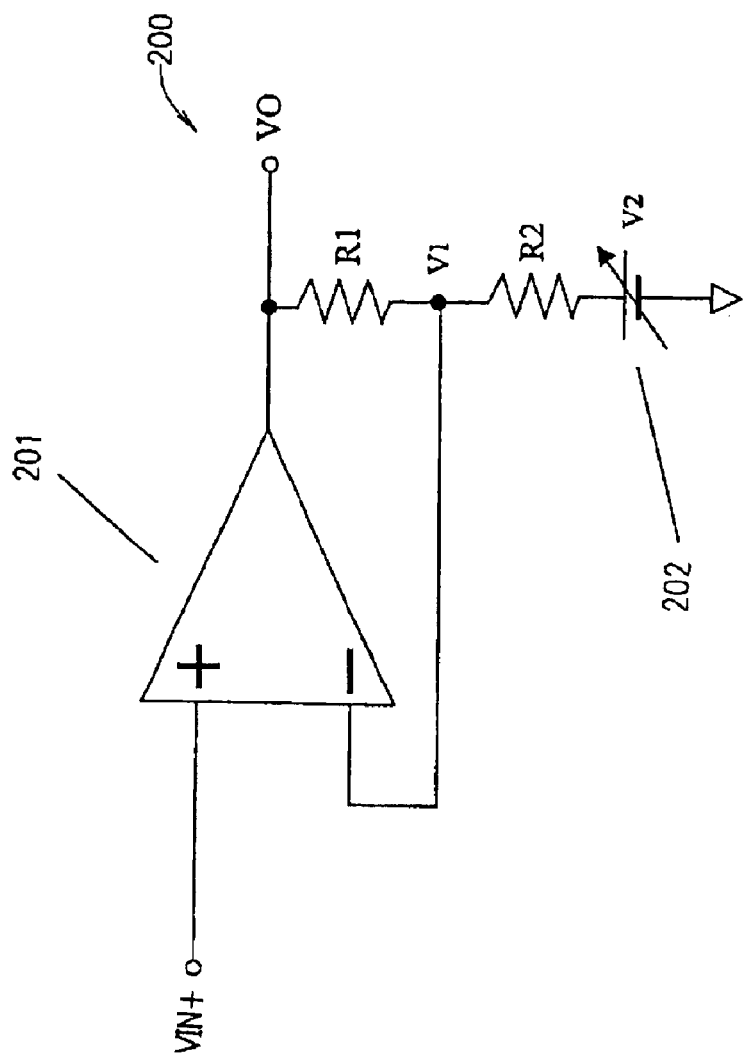
FIG. 16 is a circuit diagram of a conventional offset control circuit.

Additionally, it is also possible to configure an offset adjusting current-generating circuit 13B as shown in FIG. 15 by using bias current sources 310-1 to 310-n and P-type transistors M22-1 to M22- and M23-1 to M23-n, each of which has opposite polarity as that of the bias current sources 309-1 to 309-n and the P-type transistors M20-1 to M20- and M21-1 to M21-n, and providing inverters 15-1 to 15-n, which are connected in the direction opposite from that of the inverters 14-1 to 14-n, in the offset adjusting current-generating circuit 13A of the tenth embodiment. When the offset adjusting current-generating circuit 13 shown in FIG. 13 is configured as in FIG. 15, the effect of achieving high-speed operation and size reduction in the offset control circuits 1 and 3 described in the above first embodiment (or the above third embodiment) will not be lost in any way.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. An offset control circuit for adjusting offset voltages contained in differential voltages that are input from a pair of differential voltage input terminals and outputting the adjusted differential voltages from a pair of differential voltage output terminals, the offset control circuit comprising:

a voltage/current converting portion that includes the pair of differential voltage input terminals and a pair of differential current output terminals, that generates a pair of differential output currents corresponding to a potential difference between a pair of differential input voltages input from the pair of differential voltage input terminals, and that outputs the pair of differential output currents from the pair of differential current output terminals;

an offset adjusting current-generating portion that includes a pair of offset adjusting current-output terminals connected to the pair of differential current output terminals of the voltage/current converting portion, and at least two offset adjusting current-control terminals, that generates a pair of offset adjusting currents by being controlled by offset adjusting current control signals input from the offset adjusting current-control terminals, and that outputs the pair of offset adjusting currents from the pair of offset adjusting current-output terminals; and a current/voltage converting portion that includes a pair of differential terminals connected to the pair of differential current output terminals of the voltage/current converting portion, the pair of offset adjusting current-output terminals of the offset adjusting current-generating portion and the pair of differential voltage output terminals, that feeds a current flowing between the two differential terminals constituting the pair of differential terminals, that converts the current into a corresponding voltage, an that generates the converted voltage at the pair of differential voltage output terminals, wherein the voltage/current converting portion includes:

a pair of bias current sources connected to the pair of differential current output terminals;

a pair of first transistors whose first driving terminals are connected to the pair of differential current output terminals, respectively, and whose gates are both connected to a control terminal; and a pair of second transistors whose first driving terminals are connected to second driving terminals of the pair of first transistors, respectively, whose gates are connected to the pair of differential voltage input terminals, respectively, and whose second driving terminals are connected to a reference potential supplying point.

2. An offset control circuit for adjusting offset voltages contained in differential voltages that are input from a pair of differential voltage input terminals and outputting the adjusted differential voltages from a pair of differential voltage output terminals, the offset control circuit comprising:

a voltage/current converting portion that includes the pair of differential voltage input terminals, a pair of differential current output terminals connected to the pair of differential voltage output terminals, a pair of bias current sources to which the pair of differential current output terminals are connected, a pair of first transistors whose first driving terminals are connected to the pair of differential current output terminals and whose gates are connected to a pair of control terminals and a pair of second transistors whose first driving terminals are connected to second driving terminals of the pair of first transistors, whose gates are connected to the pair of differential voltage input terminals, respectively, and whose second driving terminals are connected to a reference potential supplying point, that generates a pair of differential output currents corresponding to a potential difference between a pair of differential input voltages input from the pair of differential voltage input terminals, and that outputs the differential output currents from the pair of differential current output terminals;

an offset adjusting current-generating portion that includes a pair of offset adjusting current-output terminals connected to the first driving terminals of the pair of second transistors of the voltage/current converting portion, and at least two offset adjusting current-control terminals, that generates a pair of offset adjusting currents by being controlled by offset adjusting current-control signals input from the offset adjusting current-control terminals, and that outputs the pair of offset adjusting currents from the pair of offset adjusting current-output terminals; and a current/voltage converting portion that includes a pair of differential terminals connected to the pair of differential current output terminals of the voltage/current converting portion, that feeds a current flowing between the two differential terminals constituting the pair of differential terminals, that converts the current into a corresponding voltage, and that generates the converted voltage at the pair of differential voltage output terminals.

3. An offset control circuit for adjusting offset voltages contained in differential voltages that are input from a pair of differential voltage input terminals and outputting the adjusted differential voltages from a pair of differential voltage output terminals, the offset control circuit comprising:

a voltage/current converting portion that includes the pair of differential voltage input terminals and a pair of differential current output terminals, that generates a pair of differential output currents corresponding to a potential difference between a pair of differential input voltages input from the pair of differential voltage input terminals, and that outputs the pair of differential output currents from the pair of differential current output terminals;

an offset adjusting current-generating portion that includes a pair of offset adjusting current-output terminals connected to the pair of differential current output terminals of the voltage/current converting portion and at least two offset adjusting current-control terminals, that generates a pair of offset adjusting currents by being controlled by offset adjusting current control signals input from the offset adjusting current-control terminals, and that outputs the pair of offset adjusting currents from the pair of offset adjusting current-output terminals; and a current/voltage converting portion that includes a pair of differential terminals connected to the pair of differential current output terminals of the voltage/current converting portion, the pair of offset adjusting current-output terminals of the offset adjusting current-generating portion and the pair of differential voltage output terminals, that feeds a current flowing between the two differential terminals constituting the pair of differential terminals, that converts the current into a corresponding voltage, and that generates the converted voltage at the pair of differential voltage output terminals, wherein the voltage/current converting portion includes:

a pair of bias current sources to which the pair of differential current output terminals are connected, respectively;

a pair of second transistors whose first driving terminals are connected to the pair of differential current output terminals, respectively, and whose gates are connected to the pair of differential voltage input terminals, respectively;

a pair of first transistors whose first driving terminals are connected to second driving terminals of the pair of second transistors, respectively, whose gates are both connected to a control terminal and whose second driving terminals are connected to a reference potential supplying point; and resistor means having a predetermined resistance and being connected between the second driving terminals of the pair of second transistors.

4. An offset control circuit for adjusting offset voltages contained in differential voltages that are input from a pair of differential voltage input terminals and outputting the adjusted differential voltages from a pair of differential voltage output terminals, the offset control circuit comprising:

a voltage/current converting portion that includes the pair of differential voltage input terminals and a pair of differential current output terminals, that generates a pair of differential output currents corresponding to a potential difference between a pair of differential input voltages input from the pair of differential voltage input terminals, and that outputs the pair of differential output currents from the pair of differential current output terminals;

an offset adjusting current-generating portion that includes a pair of offset adjusting current-output terminals connected to the pair of differential current output terminals of the voltage/current converting portion, and at least two offset adjusting current-control terminals, that generates a pair of offset adjusting currents by being controlled by offset adjusting current control signals input from the offset adjusting current-control terminals, and that outputs the pair of offset adjusting currents from the pair of offset adjusting current-output terminals; and a current/voltage converting portion that includes a pair of differential terminals connected to the pair of differential current output terminals of the voltage/current converting portion, the pair of offset adjusting current-output terminals of the offset adjusting current-generating portion and the pair of differential voltage output terminals, that feeds a current flowing between the two differential terminals constituting the pair of differential terminals that converts the current into a corresponding voltage, and that generates the converted voltage at the pair of differential voltage output terminals, wherein the voltage/current converting portion includes:

a pair of bias current sources to which the pair of differential current output terminals are connected, respectively; and a pair of transistors whose first driving terminals are connected to the pair of differential current output terminals, respectively, whose gates are connected to the pair of differential voltage input terminals, respectively, and whose second driving terminals are connected to a reference potential supplying point.

5. The offset control circuit according to claim 2, wherein the current/voltage converting portion is resistor means having a predetermined resistance and being connected between the pair of differential terminals.

6. The offset control circuit according to claim 2, wherein the current/voltage converting portion includes:

a pair of third transistors whose first driving terminals are connected to the pair of differential terminals, respectively, and whose gates are both connected to an input/output current control terminal; and a pair of fourth transistors whose first driving terminals are connected to second driving terminals of the pair of third transistors, respectively, whose gates are connected to the pair of differential terminals, respectively, and whose second driving terminals are connected to a reference potential supplying point.

7. The offset control circuit according to claim 2, wherein the current/voltage converting portion is a fifth transistor that is connected between the pair of differential terminals and whose gate is connected to an input/output current control terminal.

8. The offset control circuit according to claim 2, wherein the offset adjusting current-generating portion includes:

a current source; and a pair of sixth transistors whose second driving terminals are connected to the current source, whose gates are connected to two of the offset adjusting current-control terminals, respectively, and whose first driving terminals are connected to the pair of offset adjusting current-output terminals, respectively.

9. The offset control circuit according to claim 2, wherein the offset adjusting current-generating portion includes n (n is a natural number) sub-offset adjusting current-generating portions;

wherein the sub-offset adjusting current-generating portions each include an offset adjusting current-control terminal to which a one-bit signal out of an n-bit register signal is input such that the one-bit signals do not overlap with each other;

a current source; and a pair of seventh transistors whose second driving terminals are connected to the current source, one of whose gates is connected to the offset adjusting current-control terminal, the other of whose gates is connected to the offset adjusting current-control terminal via an inverter and whose first driving terminals are connected to the pair of offset adjusting current-output terminals, respectively; and wherein a pair of sub-offset adjusting currents generated in each of the sub-offset adjusting current-generating portions are supplied to the pair of offset adjusting current-output terminals, respectively.

10. A signal processing device comprising:

the offset control circuit according to claim 2; and a processing circuit that performs predetermined processing for a differential output voltage whose offset voltage has been adjusted with the offset control circuit; wherein the offset control circuit and the processing circuit are formed on a single chip.

11. The signal processing device according to claim 10, wherein the signal processing device is a part of a DVD reproduction device;

wherein the offset control circuit adjusts an offset voltage contained in a signal read out from a DVD and outputs the adjusted signal as a differential output voltage; and wherein the processing circuit includes:

a front-end having a filter that performs a filtering process on the differential output voltage whose offset voltage has been adjusted with the offset control circuit; and a back-end that converts an output signal from the front-end into an image signal and an audio signal.

* * * * *